(12) United States Patent
Holzmann et al.

(10) Patent No.: US 9,357,408 B2
(45) Date of Patent: May 31, 2016

(54) SWITCH-EXTENDER AND A METHOD FOR CALIBRATING

(71) Applicants: Gottfried Holzmann, Zorneding (DE); Werner Mittermaier, Erding (DE); Ralf Plaumann, Preisendorf (DE); Thomas Lutz, Munich (DE)

(72) Inventors: Gottfried Holzmann, Zorneding (DE); Werner Mittermaier, Erding (DE); Ralf Plaumann, Preisendorf (DE); Thomas Lutz, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 310 days.

(21) Appl. No.: 13/657,419

(22) Filed: Oct. 22, 2012

(65) Prior Publication Data

US 2013/0148524 A1    Jun. 13, 2013

Related U.S. Application Data

(60) Provisional application No. 61/569,352, filed on Dec. 12, 2011.

(30) Foreign Application Priority Data

Mar. 7, 2012   (EP) .................................. 12 158 439

(51) Int. Cl.
| | |
|---|---|
| *H04B 3/46* | (2015.01) |
| *H04L 25/02* | (2006.01) |
| *H04W 24/06* | (2009.01) |
| *G01R 1/20* | (2006.01) |
| *G01R 31/00* | (2006.01) |
| *G01R 35/00* | (2006.01) |
| *G01R 31/28* | (2006.01) |

(52) U.S. Cl.
CPC ............... *H04W 24/06* (2013.01); *G01R 1/206* (2013.01); *G01R 31/2889* (2013.01); *G01R 35/005* (2013.01); *H04B 3/46* (2013.01); *H04L 25/0202* (2013.01); *H04L 25/028* (2013.01); *H04L 25/0264* (2013.01)

(58) Field of Classification Search
USPC .......................................................... 370/252
See application file for complete search history.

(56) References Cited

U.S. PATENT DOCUMENTS

| | | | |
|---|---|---|---|
| 6,041,216 A * | 3/2000 | Rose et al. ........................ | 455/9 |
| 2005/0189993 A1* | 9/2005 | Behzad et al. ................ | 330/284 |
| 2009/0212882 A1* | 8/2009 | de la Puente ....... | H04L 25/0278 333/100 |
| 2010/0036369 A1* | 2/2010 | Hancock ......................... | 606/33 |
| 2012/0100813 A1* | 4/2012 | Mow et al. ................. | 455/67.12 |
| 2013/0099985 A1* | 4/2013 | Gross ............................ | 343/703 |

FOREIGN PATENT DOCUMENTS

WO    WO 2011138190 A1 * 11/2011

* cited by examiner

*Primary Examiner* — Michael Thier
*Assistant Examiner* — Yaotang Wang
(74) *Attorney, Agent, or Firm* — Ditthavong & Steiner, P.C.

(57) ABSTRACT

A switch-extender is connected to a measurement system and to several DUTs. It splits a signal from the measurement system into several signals so that the several DUTs receive the same signal and can therefore be tested in parallel. The switch-extender further includes at least one amplifier and/or at least one attenuator for every output port so that every signal has the same signal level no matter what the individual attenuation factor of the signal connectors or of the internal printed circuit board is. Furthermore a method for calibrating the measurement system as well as for the switch-extender and the signal connectors describes how to obtain the needed calibration values both for the downlink path and for the uplink path without changing the signal connector.

14 Claims, 12 Drawing Sheets

SWITCH-EXTENDER AND A METHOD FOR CALIBRATING

CROSS-REFERENCE TO RELATED APPLICATION

The present application claims foreign priority to European Patent Application No. 12 158 439.5, filed on Mar. 7, 2012, and claims priority to U.S. Provisional Application No. 61/569,352, filed on Dec. 12, 2011, the entire contents of which are herein incorporated by reference.

BACKGROUND OF THE INVENTION

1. Field of the Invention

The present invention relates to a switch-extender and a method for calibrating a measurement system with such a switch-extender, especially for testing mobile communication systems, for example mobile phones, handhelds, tablet PCs and WLAN-routers.

2. Discussion of the Background

Due to the increasing number of mobile communication systems, for example mobile phones, there is a strong demand in reducing the overall test time. As the complexity of mobile communication systems increases from generation to generation, the required test time also increases. Therefore, it is very difficult to reduce the test time for each mobile communication system. Therefore, the approach of the present invention is that the overall test time can be reduced significantly by testing several mobile communication systems, like mobile phones, in parallel.

Document US 2005/0264373 A1 describes a switching matrix that allows connecting multiple input ports to multiple output ports as well as to power sources. It is disadvantageous that document US 2005/0264373 A1 does not allow compensating different signal behavior in different signal path. Therefore, an input signal which is output at several ports has a different signal level which makes a switching matrix unsuitable for supplying a plurality of mobile communication systems in parallel with a test signal.

SUMMARY OF THE INVENTION

Therefore, embodiments of the present invention advantageously provide a switch-extender and a respective calibration method that allows connecting one input port to several output ports at the same time and that ensures that the signal level at every output port can be adjusted separately.

The inventive switch-extender has at least one input port and several output ports, wherein the at least one input port and the several output ports are connected to a first Multiplexer/Demultiplexer-means (in the following MUX/DEMUX-means or -unit) wherein the first MUX/DEMUX-means connects the at least one input port to all output ports, wherein the MUX/DEMUX-means comprises at least one amplifier for amplifying a signal at the at least one input port and/or wherein the MUX/DEMUX-means comprises at least one attenuator for each of the output ports for attenuating a signal at every output port.

It is very advantageous that at least one amplifier is connected to the at least one input port and/or the at least one attenuator is connected to each of the output ports. Therefore, a signal, which is split to different output-ports can be amplified to a certain signal level and then attenuated by an individual attenuation factor (attenuation value) to compensate for the individual signal path to obtain output signals having a predetermined signal level. This allows that every DUT that is connected with the switch-extender receives a test signal having exact the predetermined signal level which makes the whole test procedure meaningful and allows to compare the DUTs (devices under test) to each other.

The inventive method is used for calibrating a measurement system comprising a measurement unit, a switch-extender connected to the measurement unit and several signal connectors having one end connected to the switch-extender and several attenuators connected to an other end of the several signal connectors and one calibration system wherein a sequence of procedural steps are executed. First of all the other end of one signal connector is connected with an attenuator to the calibration system. Then a signal is generated with a specific signal level and/or a specific signal frequency with the measurement unit. After that a signal level and/or a signal frequency is measured with the calibration system at the output of the attenuator. In the following a difference between the measured signal level and/or the measured signal frequency and the generated signal with the specific signal level and/or the specific signal frequency is determined. Finally calibration data are calculated by using the determined difference between the measured signal level and/or the measured signal frequency and the generated signal with the specific signal level and/or the specific signal frequency.

It is advantageous that the signal connectors are used which are later also used for the measurement of the DUTs. This means that the determined difference and the calculated calibration data can be used later.

It is also advantageous if a second attenuator is connected in series with the at least one attenuator and if the at least one attenuator has a larger attenuation range and higher attenuation steps than the second attenuator. This allows that the at least one attenuator is used as a coarse attenuator having a wide attenuation range and that the second attenuator can be used for a fine attenuation thereby allowing to adjust the attenuation factor (attenuation value defining the attenuation level) over a wide range accurately.

It is further beneficial if a coupling-unit is connected between the least one attenuator or the second attenuator and the corresponding output port and if the coupling-unit has a third port at which a signal is transmitted that is input in the corresponding output port. This allows that the output port can be used as bidirectional port for the reflected and/or transmitted signal which is input thereto as well.

It is also advantageous if at least one input port and several output ports are connected to a second MUX/DEMUX-unit wherein the second MUX/DEMUX-unit comprises the same elements as the first MUX/DEMUX-unit with the difference that the at least one input port is connected to a switch and if one output port of the switch is connected to an input port of an amplifier and if an other output port of the switch is connected to an output port of another amplifier so that the at least one input port acts as bidirectional port. This allows that the only input port of the second MUX/DEMUX-unit that is connected to the measurement unit can be used as a bidirectional port. A DUT connected to the output port of the second MUX/DEMUX-unit can therefore transmit a signal to the second MUX/DEMUX-unit that will be forwarded to the measurement unit.

However, another advantage exists if the switch-extender comprises a plurality of first MUX/DEMUX-units and a plurality of second MUX/DEMUX-units wherein the input ports of the plurality of second MUX/DEMUX-units are connected to an input port of a multiplexer, wherein the output port of each multiplexer is connected to at least one amplifier of each of the plurality of the second MUX/DEMUX-units and wherein the output ports of each multiplexer are connected to the output of another amplifier of each of the plurality of the second MUX/DEMUX-units. This allows that every second MUX/DEMUX-unit can multiply the number of output ports addressable by the individual MUX/DEMUX-unit by the number of other MUX/DEMUX-units. Therefore, DUTs having more antennas can be tested without difficulties.

Last but not least it is also very advantageous if the switch-extender further comprises a processing unit and a storage unit connected to each other wherein the processing unit controls the amplification settings of the at least one amplifier and wherein the processing unit also controls the attenuation settings of the at least one attenuator so that the signal has at every output port a predetermined signal level for every frequency. This ensures that the switching times are reduced to a minimum, so that changes in the signal level resulting from changes in the frequency of operation can be compensated fast.

It is also very advantageous that the method for calibrating a measurement system includes the switch-extender that further comprises at least one attenuator or at least one attenuator and a second attenuator in series for every output port and that the attenuation factor of the at least one attenuator is adjusted or that the attenuation factor of the at least one attenuator and the second attenuator is adjusted, so that the measured signal level and/or signal frequency of the signal is equal to the generated signal with the specific signal level and/or the specific signal frequency. This ensures that despite one input signal being split into several output signals, every output signals has the same signal level.

BRIEF DESCRIPTION OF THE DRAWINGS

Different embodiments of the present invention are described exemplary in the following in reference to the description. This is done by the way of example without limitation. The same subject matter has the same reference signs. The figures in the drawings show in detail.

DETAILED DESCRIPTION OF EXEMPLARY EMBODIMENTS OF THE INVENTION

In the following some preferred embodiments of the present invention are described in detail.

Figure 1:
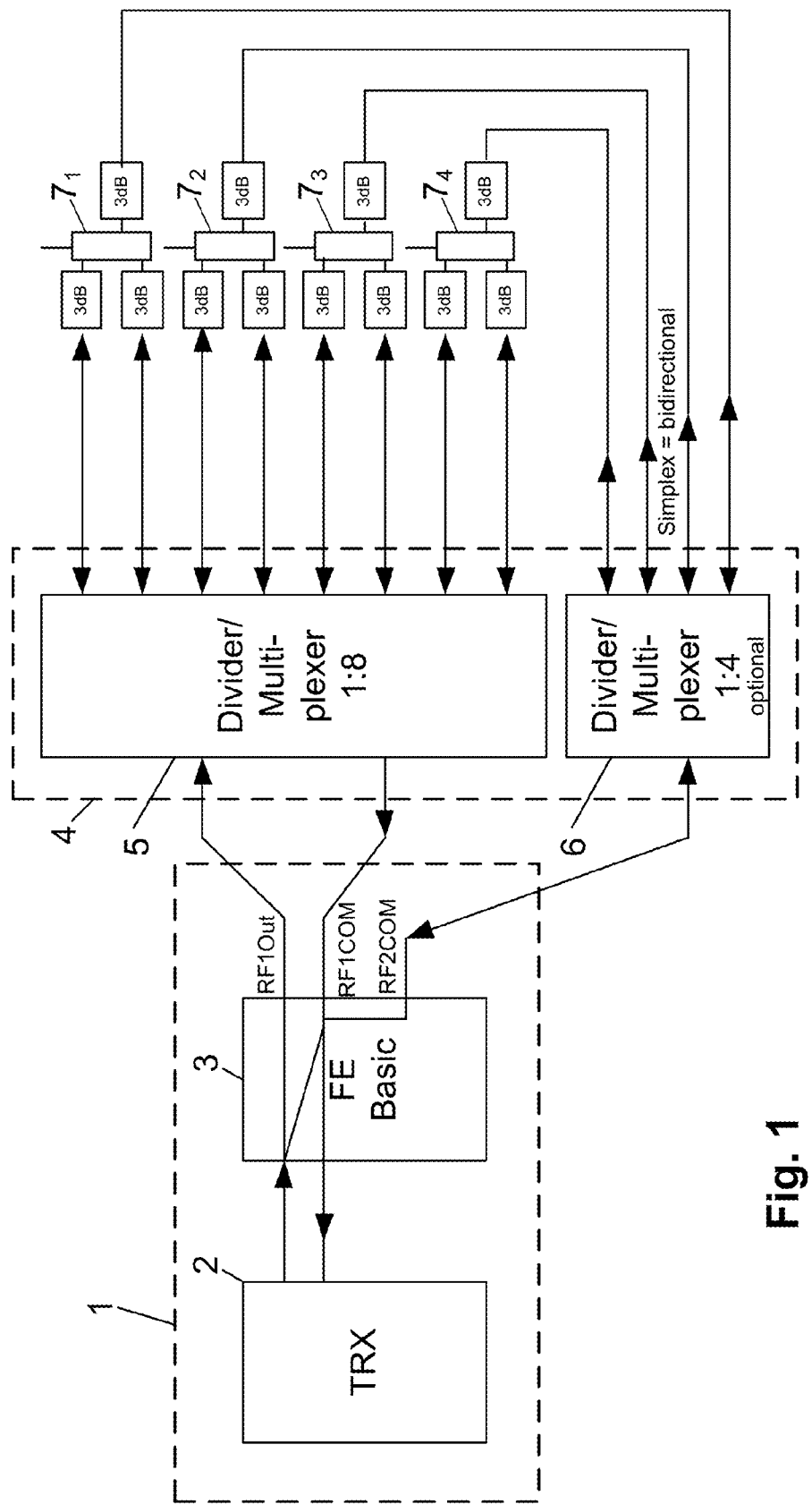
FIG. 1 a measurement system, a switch-extender and several DUTs according to an embodiment of the present invention.

FIG. 1 shows the basic principle of the present invention. It shows a measurement system 1 which is used for generating a test signal (downlink signal) and which is also used for measuring a signal transmitted from the DUTs (uplink signal). Therefore, the measurement system 1 comprises a TRX unit 2 (transmit receive) which is used for generating the base band and/or the RF (radio frequency). Furthermore the measurement system 1 also comprises a frontend 3 which comprises a reference circuit and which divides the signal from or to the TRX unit 2 into three input or output ports. For example, there is a first port "RF1Out" which is used to output the test signal (downlink signal) that is normally a high frequency signal, like a GSM or UMTS (CDMA signal in generally). Furthermore, there is a second port "RF1COM" which is used to output the test signal (downlink signal) or which can be used as an input port for a signal (uplink signal) that is transmitted by the mobile communication system to be measured by the measurement system 1. Furthermore, there is a third port "RF2COM" which can also be used to output the test signal (downlink signal) and which can also be used to input a signal (uplink signal) transmitted from the mobile communication system 7 (device under test—DUT).

However, all three ports "RF1Out", "RF1COM" and "RF2COM" are connected to a switch-extender 4 according to the embodiment of the present invention. The switch-extender 4 comprises a first MUX/DEMUX-unit 5 having a ratio of one to eight. The switch-extender 4 according to the present invention may also have a second MUX/DEMUX-unit 6 which has a ratio of one to four. The second MUX/DEMUX-unit 6 is optional. However, other ratios are also possible. The switch-extender 4 will be described in the following in detail.

Furthermore, the switch-extender 4 is preferably connected to several mobile communication systems 7, also called devices under test (DUT). This connection is done by using a cable connection. In this case, there are four devices under test, also called DUTs $7_1$, $7_2$, $7_3$, $7_4$. As mentioned before, the DUTs can be a mobile phone or a handheld PC or a tablet PC or a pocket PC or even a WLAN router. For this example, each of the DUTs $7_1$, $7_2$, $7_3$, $7_4$ has at least three antennas. However, it is possible that a DUT $7_1$, $7_2$, $7_3$, $7_4$ has also more or less than three antennas. FIG. 1 also shows that two antennas of each DUT $7_2$, $7_2$, $7_3$, $7_4$ are connected to the MUX/DEMUX-unit 5 of the switch-extender 4. Those antennas are used for communication by using the MIMO (Multiple Input, Multiple Output) technique. A third antenna of each DUT $7_2$, $7_2$, $7_3$, $7_4$ is connected to the second MUX/DEMUX-unit 6. The third antenna can be used for GPS or WLAN. It can also be used for Bluetooth or other communication standards.

The antennas of the DUT $7_1$, $7_2$, $7_3$, $7_4$ and the cable connection are not matched. Therefore, an attenuator is used between the cable and the antenna. Normally a 3 dB attenuator is used as shown in FIG. 1. Using a 3 dB attenuator, the reflected wave from the antenna of the DUT has a signal level which is 6 dB lower than the signal level of the signal (downlink) which is transmitted from the measurement system 1 over the switch-extender 4 to the antennas of the DUT $7_1$, $7_2$, $7_3$, $7_4$.

The second MUX/DEMUX-unit 6 is only used for none-cellular applications like WLAN, Bluetooth or GPS or the like. If the DUT uses only one antenna for cellular applications (none-MIMO) the switch-extender 4 can support up to eight DUTs.

If the second MUX/DEMUX-unit 6 is used, the none-cellular applications (WLAN, Bluetooth and/or GPS) are tested first, since the cellular chips (CDMA-chips) need more time to come up. The measurement system 1 generates a base band-signal (downlink) in the TRX-unit 2. This signal (downlink) is then sent to the MUX/DEMUX-unit 6 using the third port "RF2COM" of the second MUX/DEMUX unit 6. The second MUX/DEMUX-unit 6 connects the third port of the measurement system 1 to the third antenna of the first DUT $7_1$. After the test signal is sent, the first DUT $7_1$ is processing it. After the first DUT $7_1$ has processed the test signal, it outputs the results, for example the current GPS-position using the third antenna or a data bus which is not shown. The second MUX/DEMUX-unit 6 still connects the third antenna to the third port "RF2COM" of the measurement system 1. The measurement system 1 can analyze if the calculated results of the first DUT $7_1$ are correct. If the none-cellular applications are tested for the first DUT $7_1$, the second MUX/DEMUX-unit 6 connects the third port of the frontend 3 of the measurement system 1 to the third antenna of the second DUT $7_2$.

The second MUX/DEMUX-unit 6 connects all DUTs $7_1$, $7_2$, $7_3$, $7_4$ one after another to the third port of the measurement system 1. The second MUX/DEMUX-unit 6 can also connect DUTs to another port of the measurement system 1 as long as this port can also be used for transmitting and receiving signals. In this case, the second MUX/DEMUX-unit 6 can also be connected to the second port "RF1COM" of the measurement system 1.

If the measurement of the none-cellular applications of the DUTs $7_1$, $7_2$, $7_3$, $7_4$ is done, the cellular chips of the DUTs $7_1$, $7_2$, $7_3$, $7_4$ are up for operation. Now the measurement system 1 generates and transmits test signals to the first MUX/DEMUX-unit 5. The signals are generated in the TRX-unit 2 and are sent by using the first port "RF1OUT" of the frontend 3. This test signal is then split into eight signals and transmitted to the first and to the second antenna of each of the four DUTs $7_1$, $7_2$, $7_3$, $7_4$. The test signal can comprise a really long sequence that is used to calculate the bit error rate (BER) of each of the DUTs. So each of the DUTs $7_1$, $7_2$, $7_3$, $7_4$ receives a long sequence which is used to calculate the bit error rate. If the DUTs have calculated the bit error rate, the first MUX/DEMUX-unit 5 connects one DUT after another to the second port "RF1COM" of the measurement system 1. The measurement system 1 then measures the uplink signal from each of the DUTs $7_1$, $7_2$, $7_3$, $7_4$.

Figure 2:
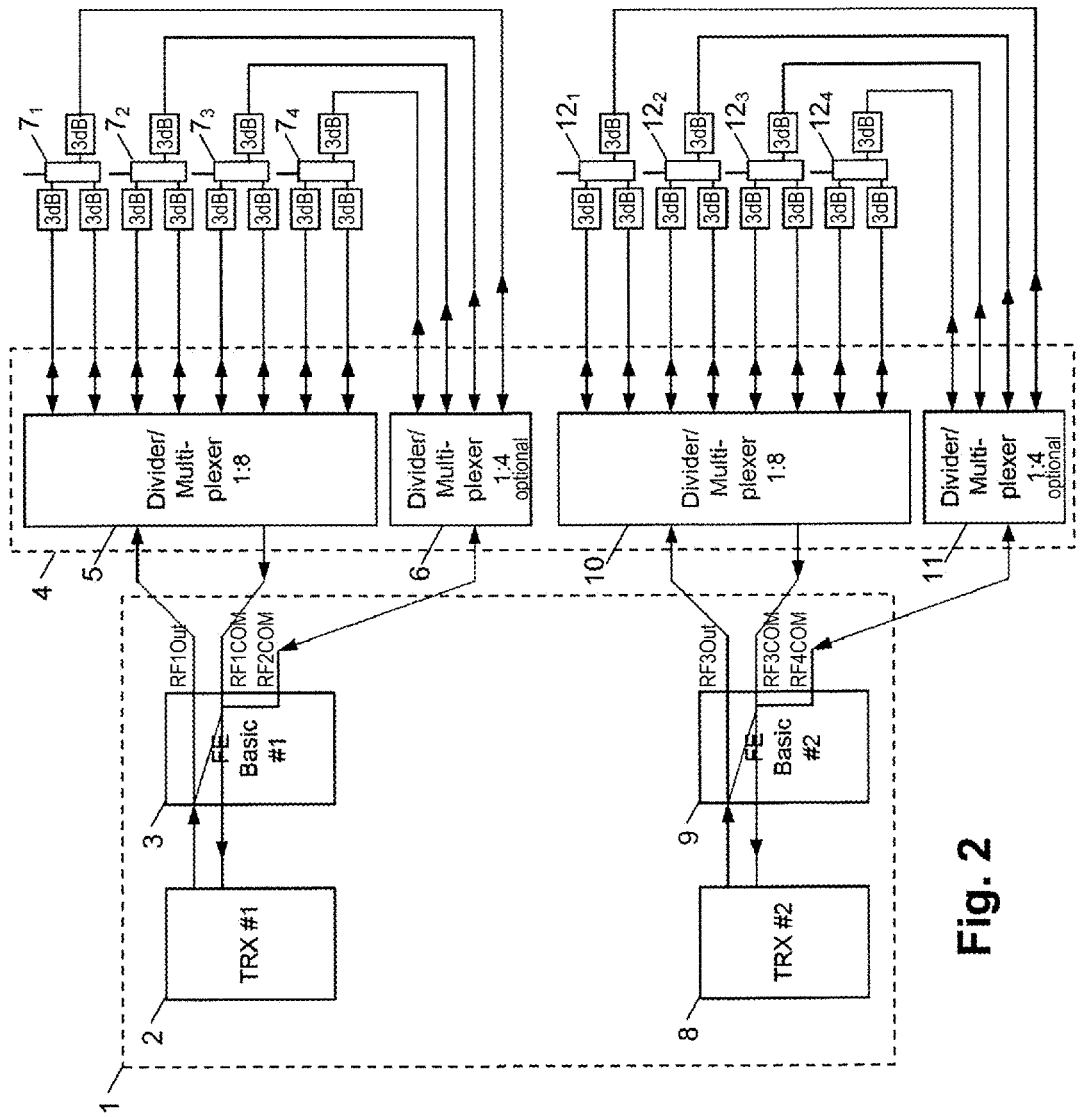
FIG. 2 a measurement system, another switch-extender and several DUTs according to an embodiment of the present invention.

FIG. 2 shows a measurement system 1 which comprises two separate TRX-units 2, 8 and two separate frontends 3, 9. Furthermore, the switch-extender 4 also comprises a first MUX/DEMUX-unit 5 and optionally a second MUX/DEMUX-unit 6 as described above. Furthermore, the switch-extender 4 comprises also a further MUX/DEMUX-unit 10 having also a ratio of one to eight and a MUX/DEMUX-unit 11 having a ratio of one to four. The MUX/DEMUX-unit 11 is also optional. Therefore, several other DUTs $12_1$, $12_2$, $12_3$, $12_4$ are connected to the further MUX/DEMUX-unit 10 and to the MUX/DEMUX-unit 11 as described above referring to the DUTs $7_1$, $7_2$, $7_3$, $7_4$.

Figure 3:
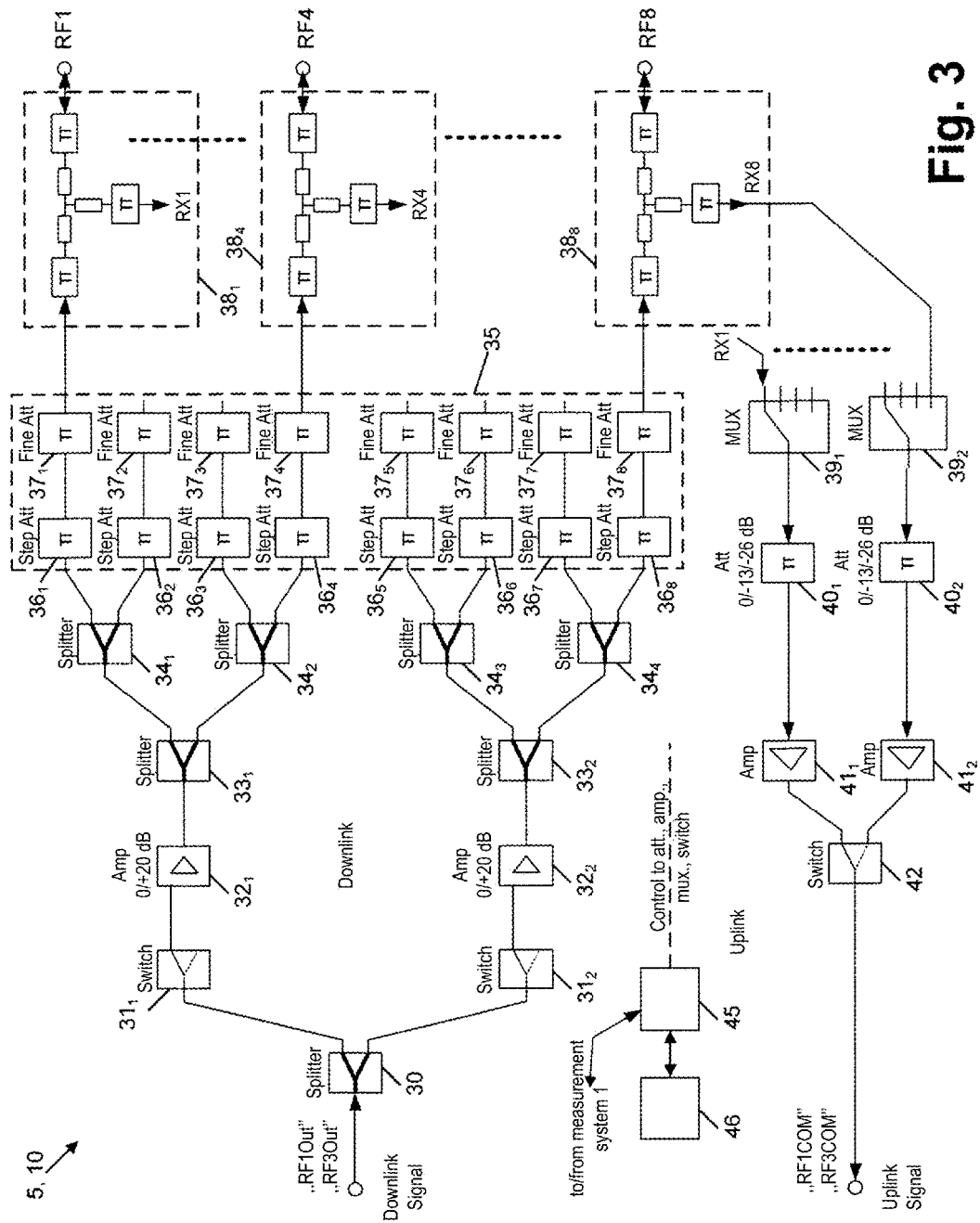
FIG. 3 a detailed configuration of the plurality of first MUX/DEMUX-units according to an embodiment of the present invention.

FIG. 3 shows a detailed schematic diagram of the first MUX/DEMUX-unit 5 according to the present invention. It can be seen that the first MUX/DEMUX-unit 5 is divided into two parts. The first part is the transmission path and the second part is the receiving path. The transmission path is used to transmit a signal (downlink signal) from measurement system 1 to the DUTs $7_1$ to $7_4$ in parallel and the receiving path is used to transmit a signal (uplink signal) from the DUTs $7_1$ to $7_4$ to the measurement system 1. The transmission path is connected to the first port "RF1Out" of the frontend 3 of the measurement system 1.

The downlink signal is split using a signal splitter 30, like a Wilkinson divider, into two signals, both having preferably the same signal level. Each output port of the signal splitter 30 is then connected to a switch $31_1$, $31_2$. One output port of each switch $31_1$, $31_2$ is not connected to anything, so the switch can be used to decouple the specific signal path at all. Normally the other output port of the switch $31_2$, $31_2$ is used to connect each output of the signal splitter 30 to an amplifier $32_1$, $32_2$. The amplifiers $32_1$, $32_2$ can be used to amplify the signal by 0 to +20 dB. The output of each of the amplifiers $32_1$, $32_2$ is then connected to another signal splitter $33_1$, $33_2$. Each output port of the further signal splitters $33_1$, $33_2$ is then connected with another signal splitter $34_1$, $34_2$, $34_3$, $34_4$. The downlink signal which is generated by the TRX-Unit 2 is split up and amplified into eight equal signals. Those signals can be used for four DUTs $7_1$, $7_2$, $7_3$, $7_4$, each of them having up to two cellular antennas operating in MIMO-mode.

However, before the eight individual downlink signals can be sent to the DUTs $7_1$, $7_2$, $7_3$, $7_4$ they are applied to a level adjustment unit 35. The level adjustment unit 35 is very important, because it comprises several attenuators. Each signal path that is used for carrying one of the split downlink signals comprises two attenuators arranged in series. Therefore, each output port of the further signal splitters $34_1$, $34_2$, $34_3$, $34_4$ is connected to a first attenuator $36_1$, $36_2$, $36_3$, $36_4$, $36_5$, $36_6$, $36_7$ and $36_8$. Those first attenuators $36_1$ are $36_8$ are also called step-attenuators. Those attenuators can be used to attenuate the split downlink signal in steps of approximately ¼ dB from 0 to 31 dB. The output port of each the first attenuators of each signal path is then connected to a second attenuator $37_1$, $37_2$, $37_3$, $37_4$, $37_5$, $37_6$, $37_7$ and $37_8$. The second attenuators are also called fine attenuators. They allow attenuating the split downlink signal in steps of approximately a 2 mdB.

Each output port of the level adjustment unit 35 or, to be more precise, each output port of the second attenuator is connected to one coupling-unit $38_1$ to $38_8$. The use of each coupling-unit is that the downlink signal which is split into up to eight individual downlink signals is transmitted to the first and to the second antenna of each DUT and that the uplink signal which is transmitted from the first and the second antenna of each DUT is transmitted back to the second output port "RF1COM" of the measurement system 1. Therefore, the coupling-unit $38_1$ to $38_8$ prevents an uplink signal which is transmitted from the DUTs to travel across the downlink signal path. The coupling-unit $38_1$ to $38_8$ is preferably a directional coupling-unit $38_1$ to $38_8$, so that the uplink signal exits the directional coupling-unit $38_1$ to $38_8$ through another port. The directional coupling-unit $38_1$ to $38_8$ comprises three attenuators and three resistors, for example connected in a T-structure. Each output port RF1 to RF8 is connected to the first or to the second antenna of each DUT $7_1$, $7_2$, $7_3$, $7_4$ using a cable and several connectors.

The task of the switch-extender 4 according to the present invention is that the downlink signal at the first and the second antenna of each of the DUTs $7_1$, $7_2$, $7_3$, $7_4$ has the same predetermined signal level. So all downlink signals that apply at the cellular antennas of each DUT have the same level. In order to obtain this object, the attenuation of the cable and the connectors have to be taken into account. This object is solved by the use of the level adjustment unit 35. The level adjustment unit 35 allows a coarse and a fine tuning of the split downlink signals. Since the first and the second attenuator within the level adjustment unit 35 are built by using transistors or the like, the signal can be attenuated within 300 microseconds or less. Relays which are used in the state of the art are preferably not used within the present invention at all.

The signal level of the downlink signal is very low, for example −100 dBm. The third output ports RX1 to RX8 of each of the coupling-units $38_1$ to $38_8$ are connected to a multiplexer $39_1$, $39_2$. Each of the multiplexers $39_1$, $39_2$ have four input ports for example and one output port. Therefore, the uplink signal which is transmitted from the first and the second DUT $7_1$, $7_2$ is available at the first multiplexer $39_1$ and the uplink signal which is transmitted from the third and the fourth DUT $7_3$, $7_4$ is available at the second multiplexer $39_2$. This is done by using the coupling-units $38_1$ to $38_8$ as described above.

The output port of each multiplexer $39_1$, $39_2$ is connected to another attenuator $40_1$, $40_2$. These attenuators $40_1$, $40_2$ are able to attenuate an uplink signal coarsely. In this example according to the present invention the attenuators $40_1$, $40_2$ can attenuate an uplink signal in steps of 0 dB, −13 dB and −26 dB. It is also possible to use an attenuator $40_1$, $40_2$ which attenuates an uplink signal in much smaller steps. If the DUT $7_1$, $7_2$, $7_3$, $7_4$ transmits an uplink signal having a signal level of 33 dBm for example, the attenuation factor of the attenuator $40_1$, $40_2$, is selected to the highest possible value, in this example −26 dB. If the DUT transmits an uplink signal with a signal level of 0 dBm the attenuator $40_1$, $40_2$ selects the lowest possible attenuation factor, in this example 0 dB.

The output port of each of the attenuators $40_1$, $40_2$ is connected to an amplifier $41_1$, $41_2$. Each amplifier $41_1$, $41_2$ amplifies the input signal to an output signal having a desired signal level. The amplifier factor is chosen so that the measurement system 1 measures the uplink signal with the highest possible precision.

The output port of each amplifier is connected to a switch 42. By using the switch 42 and one of the multiplexer $39_2$, $39_2$ a control unit within the switch-extender 4 or within the measurement system 1 selects the uplink signal from one antenna of one of one DUT $7_1$, $7_2$, $7_3$, $7_4$ to be measured within the measurement system 1. The output port of the switch 42 is then connected to the second port "RF1COM" of the measurement system 1. It can also be connected to the third port "RF2COM" or to any port within the measurement system 1 which allows inputting an uplink signal for further analyses.

However, the schematic diagram of FIG. 3 can also be used within the further MUX/DEMUX-unit 10 as shown in FIG. 2.

The level adjustment unit 35 selects an attenuation value for the first attenuators $36_1$ to $36_8$ and for the second attenuators $37_1$ to $37_8$ which is based on the individual cable and connectors as well as on the individual signal path. The correction data is obtained for each frequency point for each signal path as well as for each cable and connector. Therefore, if the frequency band for which the downlink signal is transmitted is changed, all attenuators within the level adjustment unit 35 have to be set for their new attenuation factor.

Furthermore, the amplifiers $32_1$, $32_2$ and $41_1$, $41_2$ as well as the attenuators $40_1$, $40_2$ may also need to be set for the new frequency. This is done preferably very fast in less than 300 microseconds. The control of the level adjustment unit 35 as well as of the amplifiers $32_1$, $32_2$, as well as of the amplifiers $41_1$, $41_2$ and as well as of the attenuator $40_1$, $40_2$ can be done in three different ways.

First of all, the aforementioned components can be connected to the measurement system 1 directly. However, only very fast connection types are recommended. This could be done by an interface with a lot of parallel data lines applying a high clock rate. The measurement system 1 selects all attenuation factors as well as all amplifier factors for the selected frequency of operation of the downlink signal. This information can be extracted from calibration data which will be discussed below. SPI-commands allow those components to be programmed by the measurement system 1.

A more preferred second possibility for adjusting the aforementioned components can be done by incorporating a processing unit 45 within the switch-extender 4. The processing unit is connected to the level adjustment unit 35 and therein with the first attenuators and the second attenuators. The processing unit 45 is further connected to the amplifier $32_1$, $32_2$, $41_1$, $41_2$ as well as to the attenuators $40_1$, $40_2$ and optional to the multiplexers $39_1$, $39_2$ and the switches $31_1$, $31_2$, 42. Furthermore, the processing unit is also connected to the measurement system 1. The measurement system 1 then signals the processing unit 45 the values of the attenuation and/or the amplification factors to be set and optional the position of the switches and the multiplexers. The communication itself between the processing unit 45 and the components within the switch-extender 4 is done without any knowledge of the measurement system 1. For example, the processing unit 45 can communicate by using the SPI-commands on a single line or by using parallel data lines.

A third possibility is that the processing unit 45 only receives the frequency and the signal level of the downlink signal which is transmitted by the measurement system 1. The processing unit 45 then alternates all attenuation factors or amplification factors by itself. Therefore, besides the processing unit 45 a further storage unit 46 is needed where all calibration data are stored. This could be done by using a lookup-table comprising all attenuation factors and/or amplification factors needed for an individual signal level as well as for an individual signal frequency. The processing unit 45 then reads out the storage unit 46 and alternates those factors as required.

As shown in FIG. 3 it is possible to transmit a downlink signal on eight signal paths in parallel. On the other hand, it is only possible to receive one uplink signal which is transmitted from one antenna of one DUT $7_1$, $7_2$, $7_3$, $7_4$ at one time. In order to receive the uplink signal from the other antenna or from other DUTs the multiplexer $39_1$, $39_2$ or the switch 42 have to be changed. This can also be done by the processing unit 45 or by the measurement system 1 directly. Therefore, the multiplexer $39_1$, $39_2$ as well as the switch have to be connected to the processing unit 45 and/or to the measurement system 1. This can also be done by well known data connection types or by a parallel interface. The same also applies for the further MUX/DEMUX-unit 10.

Figure 4:
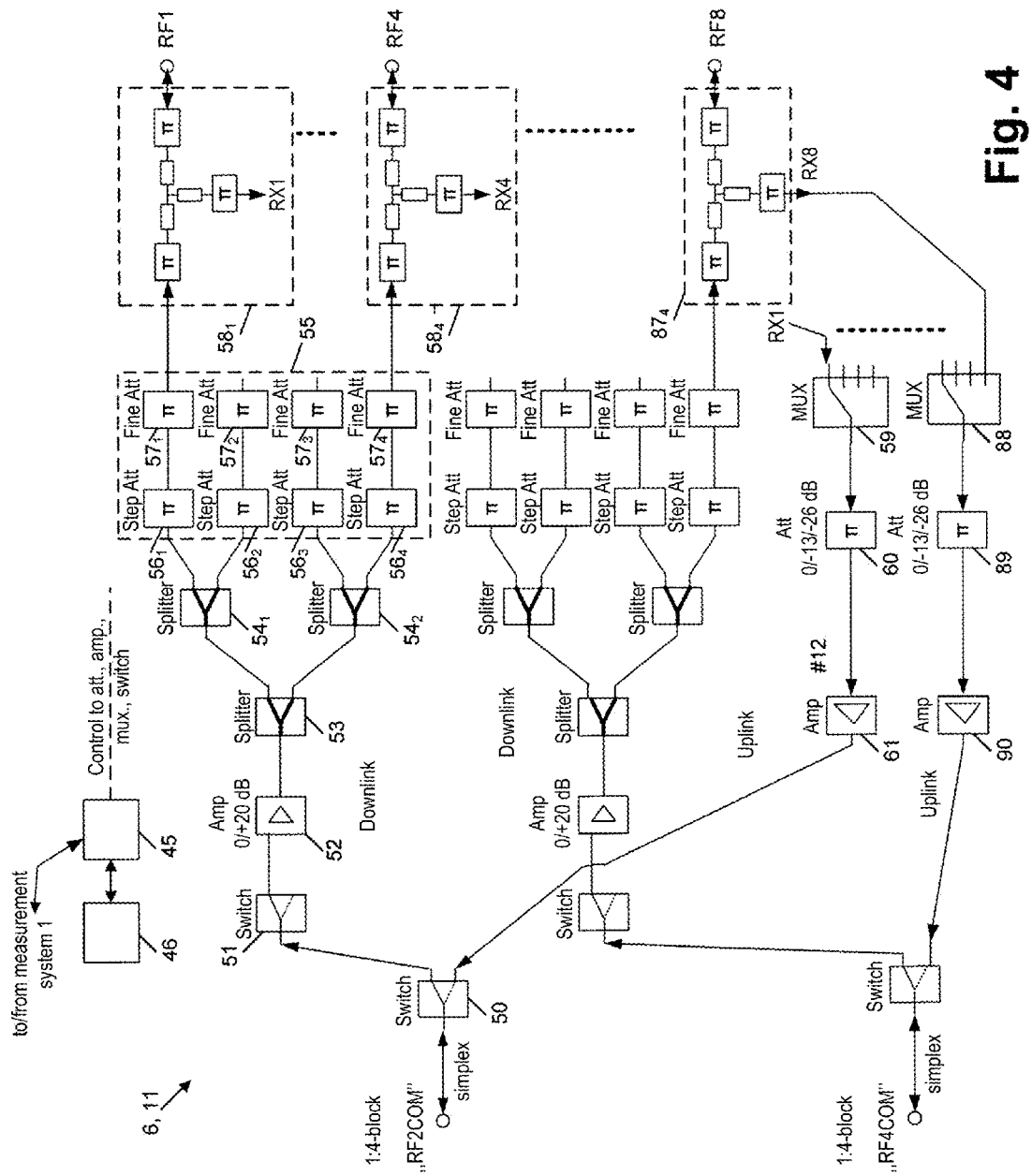
FIG. 4 a detailed configuration of the plurality of second MUX/DEMUX-units according to an embodiment of the present invention.

FIG. 4 shows a schematic diagram of the second MUX/DEMUX-unit 6 as well as of the MUX/DEMUX-unit 11 according to the present invention. As already described, the second MUX/DEMUX-unit 6 is used to measure the none-cellular applications within the DUT $7_1$, $7_2$, $7_3$, $7_4$. As already explained, the measurement system 1, in particular the TRX-unit 2 and the frontend 3 generate a downlink signal which is output at the third output port "RF2COM". For the second TRX-unit 8 and the second frontend 9 the subject matter as explained in detail above stays the same. It only differs in the names used for the reference signs. As already said, the third port "RF2COM" can be used to output a downlink signal or to input an uplink signal. In the following the case where a downlink signal is transmitted to the third antenna of the DUT $7_1$, $7_2$, $7_3$, $7_4$ is described. The output port "RF2COM" is connected to a switch 50. One output port of the switch 50 is connected to another switch 51. One output of the switch 51 is connected to an amplifier 52. The amplifier 52 is used to amplify the downlink signal by 0 to +20 dB. The output of the amplifier 52 is connected to a signal splitter 53. The signal splitter 53 can be a Wilkinson divider.

Each output port of the signal splitter 53 is connected to an input port of another signal splitter $54_1$, $54_2$. Each output port of the further signal splitters $54_1$, $54_2$ is connected to the second level adjustment unit 55. The second level adjustment unit 55 comprises the same structure as the level adjustment unit 35 as described in FIG. 3. In contrast to the level adjustment unit 35 as described in FIG. 3, the second level adjustment unit 55 only comprises four signal paths. In each signal paths, there are two attenuators arranged in series. A first attenuator $56_1$, $56_2$, $56_3$, $56_4$ is used to attenuate the split downlink signal in a coarse step. For example, the first attenuator $56_1$ to $56_4$ can attenuate the split downlink signal in steps of ¼ dB over a range from 0 to 31 dB. The output port of the first attenuator $56_1$ to $56_4$ is then connected to an input port of a second attenuator $57_1$, $57_2$, $57_3$, $57_4$. The second attenuator is used to attenuate the split downlink signal in finer steps. For example, the second attenuators $57_1$ to $57_4$ can attenuate a signal in steps of 2 mdB or the like. The output port of the second attenuators $57_1$ to $57_4$ is then connected to a coupling-unit $58_1$ to $58_4$. The design of the coupling-unit $58_1$ to $58_4$ as shown in FIG. 4 is the same as the design of the coupling-unit $38_1$ to $38_8$ as shown in FIG. 3 so that a reference is made to the description above. The second output port RF1 to RF4 of the coupling-unit $58_1$ to $58_4$ is connected to the third antenna of the DUTs $7_1$, $7_2$, $7_3$, $7_4$.

If the measurement system 1 generates and transmits a downlink signal to the third antenna of all DUTs $7_1$, $7_2$, $7_3$, $7_4$ the second level adjustment unit 55 makes sure that the level of the downlink signal is the same for all signal paths at the third antenna of each DUT $7_1$, $7_2$, $7_3$, $7_4$. This is done by using calibration data of the cable and the connector as well as of each individual signal path. The amplification as well as the attenuation value of each attenuator is selected in such a way that different frequency behaviors over a frequency span are compensated. This also applies for different signal levels. Therefore, every downlink signal frequency and every downlink signal level corresponds to a separate data set which includes the calibration data that is used for setting the amplifier 52 and the first attenuator $56_1$ to $56_4$ and the second attenuator $57_1$ to $57_4$ properly.

The same also applies for every uplink signal. The uplink signal transmitted from the third antenna of each DUT $7_1$, $7_2$, $7_3$, $7_4$ is decoupled within the coupling-unit $58_1$ to $58_4$ to the third output port RX1 to RX4. The third output port RX1 to RX4 of all coupling-units $58_1$ to $58_4$ are connected to a multiplexer 59. The multiplexer has four input ports connected to each of the coupling-units $58_1$ to $58_4$ and one output port connected to an attenuator 60. The attenuator 60 attenuates the uplink signal in a coarse way. For example, an attenuation factor of 0, -13, -26 dB can be selected. However, also other attenuators can be used which allow the selection of an attenuation factor having finer steps. The output port of the attenuator 60 is then connected to the input port of an amplifier 61. The amplifier 61 is then connected to the second "output" port of the switch 50. The switch 50 then connects the output port of the amplifier 61 to the third port "RF2COM" of the measurement system 1. The attenuator 60 is thereby selected to attenuate a strong signal with a higher attenuation factor than a weak signal. For example, if the DUT transmits an uplink signal having a signal level 30 dB, the attenuator 60 attenuates this signal by -26 dB. On the other hand, if the DUT transmits a signal having a signal level of 0 dB, the attenuator 60 attenuates this signal with 0 dB. Other values are also possible.

As already described in FIG. 3 the amplifiers 52, 61 and the attenuators $56_1$ to $56_4$ and $57_1$ to $57_4$ and 60 are controlled by the measurement system 1 directly or by the processing unit 45. The same also applies for the switch 50, the switch 51 and the multiplexer 59. The switch 51 can be used to separate the transmitting path from the receiving path in order to increase the isolation between them.

As already explained, the components can be controlled by the measurement system 1 directly. In this case, the measurement system 1 sets all switch positions and/or all attenuation and/or amplification factors. On the other hand, the measurement system 1 can signal the processing unit 45 the switching positions and the amplification and/or attenuation factors. The third possibility is that the measurement system 1 only informs the processing unit 45 about the frequency and the signal level of the downlink signal and/or the number of the DUT which has to be measured in the uplink path. The processing unit 45 then reads the settings from a storage unit 46 and makes the needed adjustments.

The same also applies for the MUX/DEMUX-unit 11 as also shown in FIG. 4. For those components no reference signs are placed. However, all explanations made to the second MUX/DEMUX-unit 6 are also valid for the MUX/DEMUX-unit 11.

Figure 5:
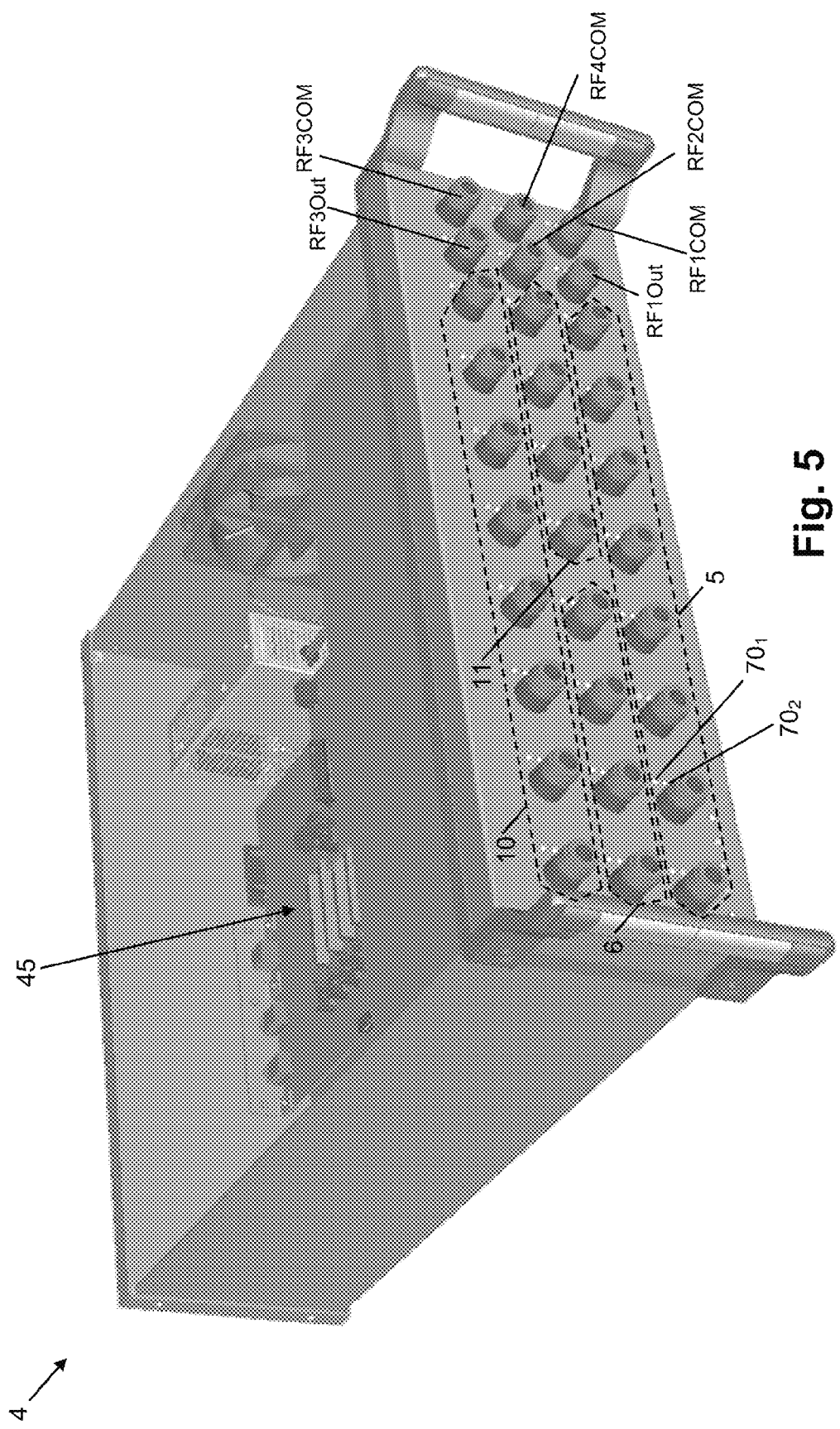
FIG. 5 a 3-dimensional view of the exemplary embodiment of the switch-extender 4 according to the present invention.

FIG. 5 shows a 3-dimensional view of the exemplary embodiment of the switch-extender 4 according to the present invention. The switch-extender 4 comprises a series of input and/or output ports. The ports for connecting the switch-extender 4 to the measurement system 1 are located on the right side of the switch-extender 4. FIG. 5 shows the ports "RF1Out", RF1COM" and "RF2COM" for connecting the switch-extender 4 to the first frontend 3 within the measurement system 1. Furthermore, FIG. 5 also shows the ports "RF3Out", "RF3COM" and "RF4COM" for connecting the switch-extender 4 to the second frontend 9 within the measurement system 1. In this exemplary embodiment, the ports for connecting the switch-extender 4 to the measurement system 1 are shown on the right, but they can also be located anywhere on the front or the rear panel of the switch-extender 4.

The other ports are used for connecting the switch-extender 4 to the series of antennas of the DUTs $7_1$, $7_2$, $7_3$, $7_4$ and $12_1$ to $12_4$. For example eight ports on the bottom row from left to right represent the output and/or input ports of the MUX/DEMUX-unit 5 as shown in FIG. 3. Within FIG. 3 these ports are named RF1 to RF8. The top row comprises the input and/or output ports for the further MUX/DEMUX-unit 10 which is connected to the second frontend 9. With respect to FIG. 2, also eight ports are used therefor. The row in the middle is used for the second MUX/DEMUX-unit 6 as well as for the MUX/DEMUX-unit 11. In this exemplary embodiment the four ports from left to right represent the output and/or input ports of the second MUX/DEMUX-unit 6, whereas the four ports following on the right represent the input and/or output ports of the MUX/DEMUX-unit 11. However, it is obvious that the input and/or output ports can be arranged in different ways. Beside every port, there are two LEDs $70_1$, $70_2$. Those LEDs $70_1$, $70_2$ indicate whether the individual port is used as an output port or an input port.

All ports are mounted directly on a printed circuit board. Preferably there are no cable connections. There is normally one printed circuit board for each row using connectors to connect the individual printed circuit boards together. All printed circuit boards are controlled by a central processing unit 45. However, as described above, the ports can also be controlled by the measurement system 1 itself.

Figure 6:
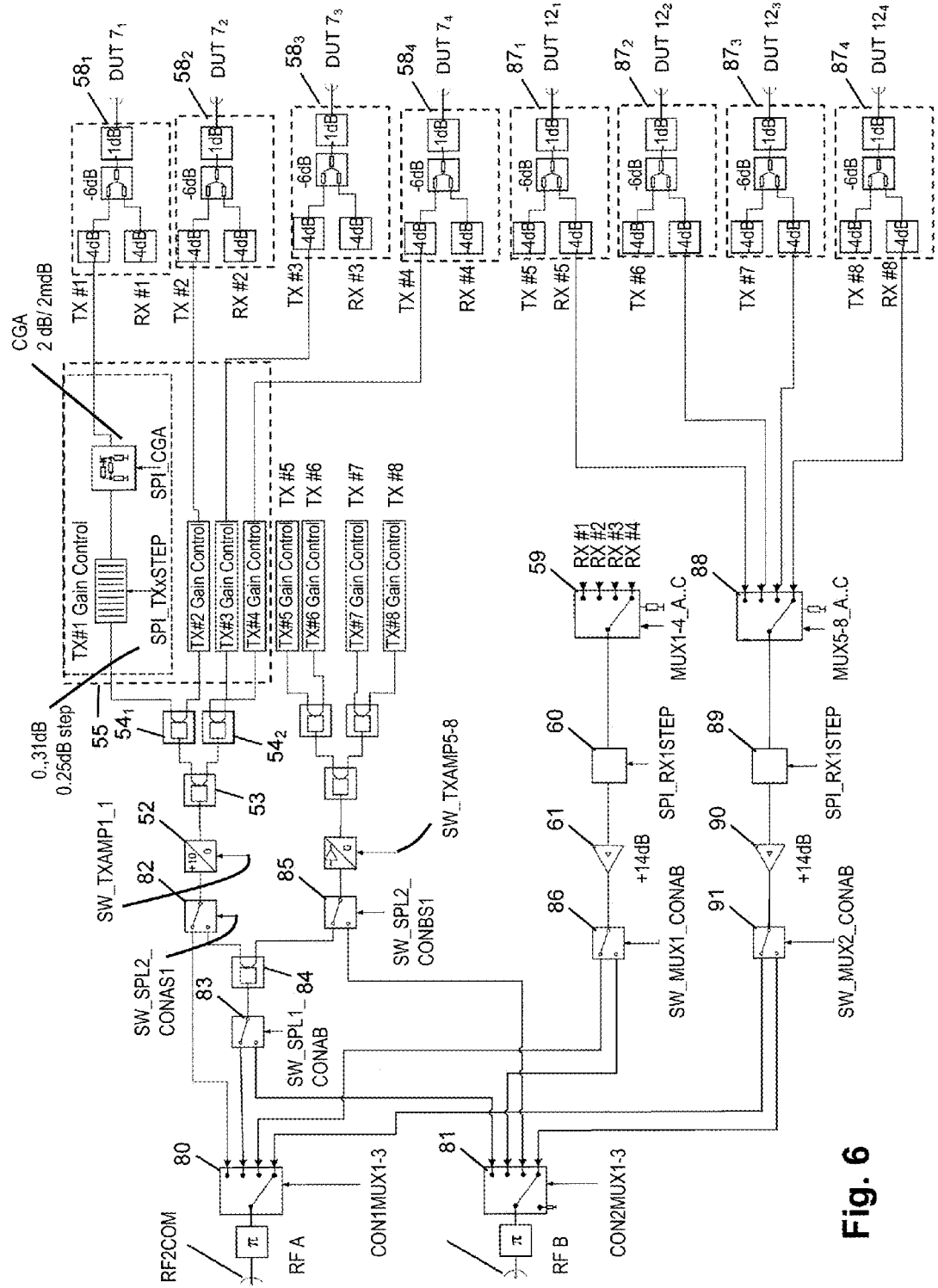
FIG. 6 another detailed configuration of the plurality of second MUX/DEMUX-units sharing the output ports of each other according to an embodiment of the present invention.

FIG. 6 shows a further exemplary embodiment of a schematic diagram according to the present invention. According to FIG. 5 the output and/or input ports in the middle of the row are shared between the first frontend 3 and the second frontend 9. One possibility on how to connect these ports with the measurement system 1 is shown in FIG. 4. As already described above, it is not possible for the first frontend 3 and for the second frontend 9 to use the output ports of the switch-extender 4 from each another. This means that the first frontend 3 can only address four DUTs $7_1$, $7_2$, $7_3$, $7_4$ each having one third antenna. The same applies for the second frontend 9. The second frontend 9 can also only address four DUTs $12_1$ to $12_4$ each having one third antenna. However, some DUTs may have more than three antennas. Therefore, it would be desirable if the first frontend 3 could also use the output and/or input ports of the switch-extender 4 linked to the second frontend 9.

FIG. 6 describes a possibility that allows the first frontend 3 to use the input and/or output ports of the second MUX/DEMUX-unit 6 as well as the input and/or output ports of the MUX/DEMUX-unit 11. On the other hand, FIG. 6 also shows the possibility for the second frontend 9 to use the input and/or output ports of the MUX/DEMUX-unit 11 as well as the input and/or output ports of the second MUX/DEMUX-unit 6.

As shown in FIG. 6, the port "RF2COM" is connected to a multiplexer 80 and the port "RF4COM" is connected to a multiplexer 81. It is noted that the ports "RF2COM" and "RF4COM" are bidirectional ports which can be used as output ports as well as input ports. Therefore, the wording "multiplexer" is always used instead of the wording "demultiplexer". One output port of the multiplexer 80 can be connected to the transmit path as shown in FIG. 4. The transmit path comprises another switch 82 and the well-known circuit elements 52, 53, $54_1$, $54_2$, 55 and $58_1$ to $58_4$.

A second output of the multiplexer 80 can also be connected to the second transmit path which was only used in FIG. 4 by the second frontend 9. The second output of the multiplexer 80 is therefore connected to a switch 83 and in row to the switch 83 to a signal splitter 84. One outfit of the splitter 84 is connected to the switch 82 and the other output of the signal splitter is connected to the switch 85. The output of the switch 85 is thereby connected to the second signal path. The circuit elements of the second signal path are the same as the circuit elements of the first signal path.

The same applies for the uplink signal, namely the signal which is transmitted from the third antenna of the DUT $7_1$, $7_2$, $7_3$, $7_4$ as well as for the uplink signal which is transmitted from the third antenna of the DUT $12_1$ to $12_4$. As described in FIG. 4, coupling-units $58_1$ to $58_4$ are used to decouple the uplink signal transmitted by the third antenna of the DUT $7_1$, $7_2$, $7_3$, $7_4$. The uplink signal is decoupled at the third port of the coupling-unit $58_1$, to $58_4$. These ports are called RX1 to RX4. These ports are connected to a multiplexer 59. The multiplexer 59 selects one uplink signal at the same time and forwards it to an attenuator 60. The output of the attenuator 60 is connected to an amplifier 61. This subject matter is also described with respect to FIG. 4. Within FIG. 6 the output of the amplifier 61 is connected to a switch 86. The output of the switch 86 is connected to the multiplexer 80.

The same also applies for the uplink path of the DUTs $12_1$ to $12_4$. The uplink signal transmitted from the DUTs $12_1$ to $12_4$ is decoupled by the coupling-units $87_1$ to $87_4$. Those coupling-units are integrated within a switch-extender 4 in the MUX/DEMUX-unit 11. The uplink signal is then fed to a multiplexer 88. The multiplexer 88 selects one uplink signal at the same time and forwards it to another attenuator 89. The output port of the attenuator 89 is then connected to an amplifier 90. The output of the amplifier 90 is further connected to switch 91. One output of the switch 91 is also connected to the multiplexer 80. The multiplexer 88 is the same multiplexer as the multiplexer 59. The attenuator 89 is the same attenuator as the attenuator 60. The amplifier 90 is the same amplifier as the amplifier 69. This also applies for coupling-units $87_1$ to $87_4$ with respect to the coupling-units $58_1$ to $58_4$.

The aforementioned structure allows the first frontend 3 to address the third antenna of the DUTs $7_1$ to $7_4$ and $12_1$ to $12_4$. The first frontend 3 can transmit a downlink signal to all third antenna ports of the DUTs $7_1$, to $7_4$ and $12_1$ to $12_4$ at the same time. However, the uplink signal from the third antenna of every DUT $7_1$, $7_2$, $7_3$, $7_4$ and $12_1$ and $12_4$ can be fed through the input port "RF2COM" to the first frontend 3 one after another. The same also applies for the second frontend 9. The bidirectional port "RF4COM" is connected to the multiplexer 81 as described above. The output ports of the multiplexer 81 are connected to the switch 83 as well as to the switch 85 as well as to the switch 86 and to the switch 91. Therefore, it is also possible for the second frontend 9 to address all third antenna ports of all DUTs $7_1$ to $7_4$ and $12_1$ to $12_4$. The second frontend 9 can therefore transmit the downlink signal to all DUTs $7_1$ to $7_4$ and $12_1$ and $12_4$ at the same time. The uplink signal transmitted from each DUT at the third antenna board can be measured one after another by switching the multiplexer 59 and 88 as well as the switches 86 and 91 as well as the multiplexer 81 accordingly.

To sum it up, the above described structure of the switch-extender 4 having further multiplexers 80, 81 for each of the plurality of the second MUX/DEMUX-units 6 that are connected to every downlink path and to every uplink path used by the second MUX/DEMUX-units 6 allows the plurality of the second MUX/DEMUX-units 6, 11 to access all components within the uplink path as well as within the downlink path of each other thereby doubling the available output ports.

However, all components like the switches, the amplifiers, the attenuators, the multiplexers can be controlled directly by the measurement system 1 or they can be controlled by a processing unit 45. The subject matter is described in detail above so that a reference is made thereto.

Figure 7:
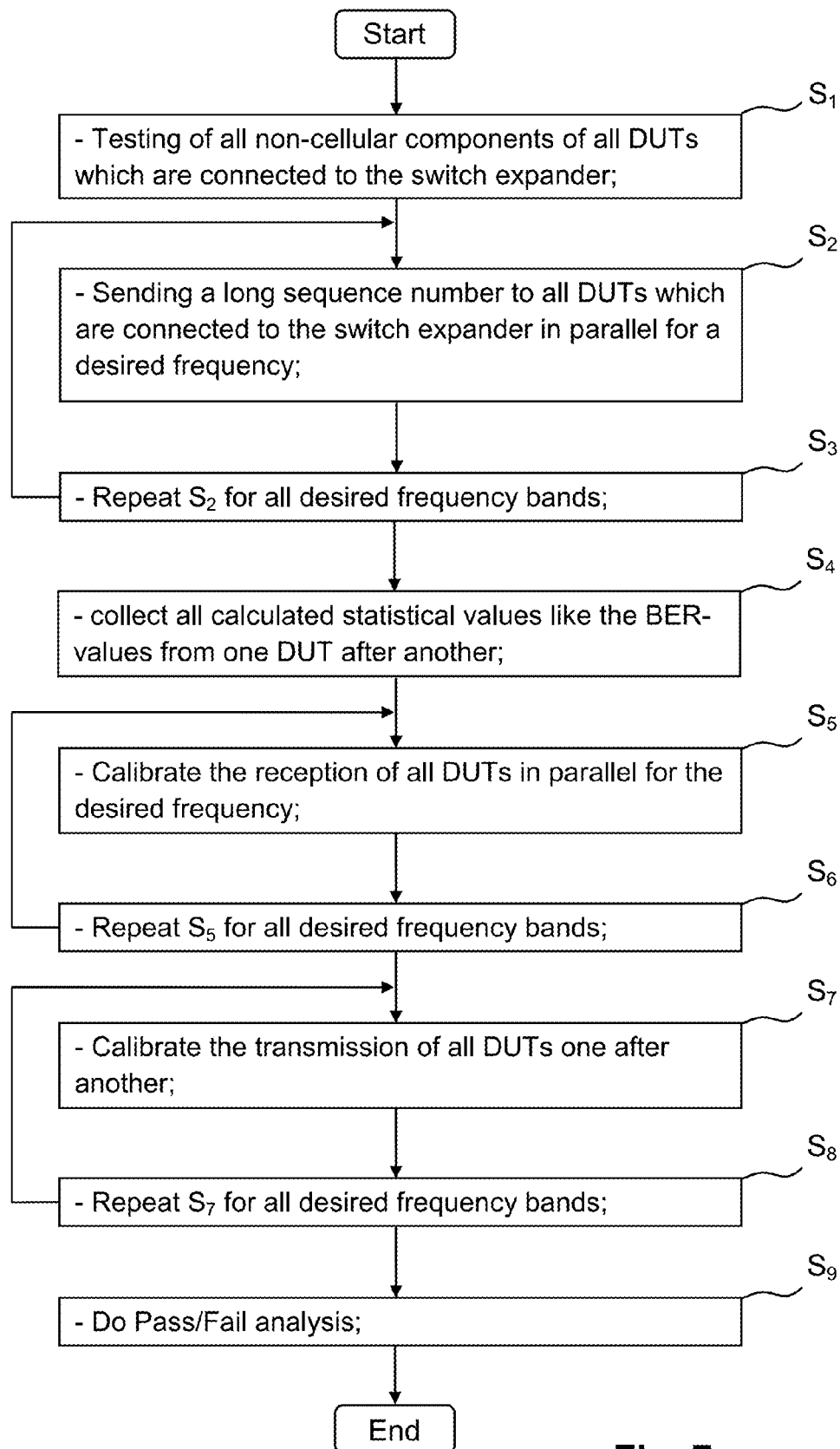
FIG. 7 a flow chart diagram of a test routine according to an embodiment of the present invention.

FIG. 7 shows a flow chart diagram that describes the proceeding for testing several DUTs with the switch-extender 4 and the measurement system 1 according to the present invention. After all DUTs are connected to the switch-extender 4, the procedural step $S_1$ is executed. Within the step $S_1$ all DUTs are powered up and the non-cellular components of all DUTs are tested. As described above, those components are connected to the third antenna of each DUT. For example, in the step $S_1$ Bluetooth services, GPS services or WLAN services can be tested. As already explained in detail, it is also possible that the measurement system 1 transmits a downlink signal to all DUTs $7_1$ to $7_4$ and/or $12_1$ to $12_4$ simultaneously. After that the third antenna of each DUT is connected one after another with the measurement system 1 for measuring the uplink signal.

If the non-cellular components are tested, the procedural step $S_2$ is executed. The procedural step $S_2$ is preferably executed when the cellular components are booted. The cellular components comprise for example CDMA-chips. Those chips have a longer boot time than the non-cellular components. Within the procedural $S_2$ a downlink signal is sent from the measurement system 1 to all DUTs $7_1$ to $7_4$ and $12_1$ to $12_4$ which comprises a long data sequence. This sequence is well known and allows the DUTs to calculate the bit error rate for example. In order to obtain a good statistic, the sequence is transmitted over a longer period, for example 10 seconds.

After the bit error rate is calculated by all DUTs in parallel for a desired frequency and/or for desired signal level, the procedural step $S_3$ is executed. Within the procedural step $S_3$ the procedural step $S_2$ is repeated for all desired frequency bands and/or for all desired signal levels. The DUTs further calculate the bit error rate.

Afterwards the procedural step $S_4$ is executed. Within the procedural step $S_4$, the measurement system 1 collects all calculated BER-values for one DUT after another. This is done by decoupling the uplink signal which is transmitted from the DUT by using the coupling-unit $58_1$ to $58_4$ and $87_1$ to $87_4$. As already described each frontend 3, 9 can only receive one uplink signal at the same time. However, the time for collecting the calculated BER-values is much shorter than the time for sending the sequence to all DUTs. Therefore, it does not matter that all DUTs cannot transmit the uplink signal at the same time.

In the following, the procedural step $S_5$ is executed. Within the procedural step $S_5$, the reception for every DUT is calibrated in parallel or one after another for the desired frequency. This is done by using the method and the system which is described in the U.S. patent application US 2009/0209249 A1 which is hereby incorporated by reference. The time between the steps wherein the signal level is lowered has to be as long as the time it needs to adjust the attenuators and the amplifiers. 300 microseconds should be enough.

Afterwards, the procedural step $S_6$ is executed. In the procedural Step $S_6$, the step $S_5$ is repeated for all desired frequency bands.

After that, the procedural step $S_7$ is executed. Within the procedural step $S_7$ all DUTs are calibrated one after another for their transmission behavior. The method and the system that are used therefore are also described in the U.S. patent application US 2009/0209249 A1 which is hereby incorporated by reference. Each frontend 3, 9 receives only one uplink signal at the same time. The uplink signal is thereby stepped down continuously. However, the time for each step has to be chosen in such a way that the switch-extender 4 has enough time to adjust the settings for the attenuators, the amplifiers and the switches. This is done for all DUTs one after another.

Afterwards, the procedural step $S_8$ is executed. Within the procedural step $S_8$ the former step $S_7$ is repeated for all desired frequency bands.

Last but not least, a Pass/Fail-analysis is performed within the procedural step $S_9$.

It has to be noted that procedural steps $S_1$ to $S_9$ need not to be executed in the described order. For example, it is also possible that the method is finished after the procedural step $S_1$ or after the procedural step $S_3$ or after the procedural step $S_8$. The order can also be mixed.

Figure 8:
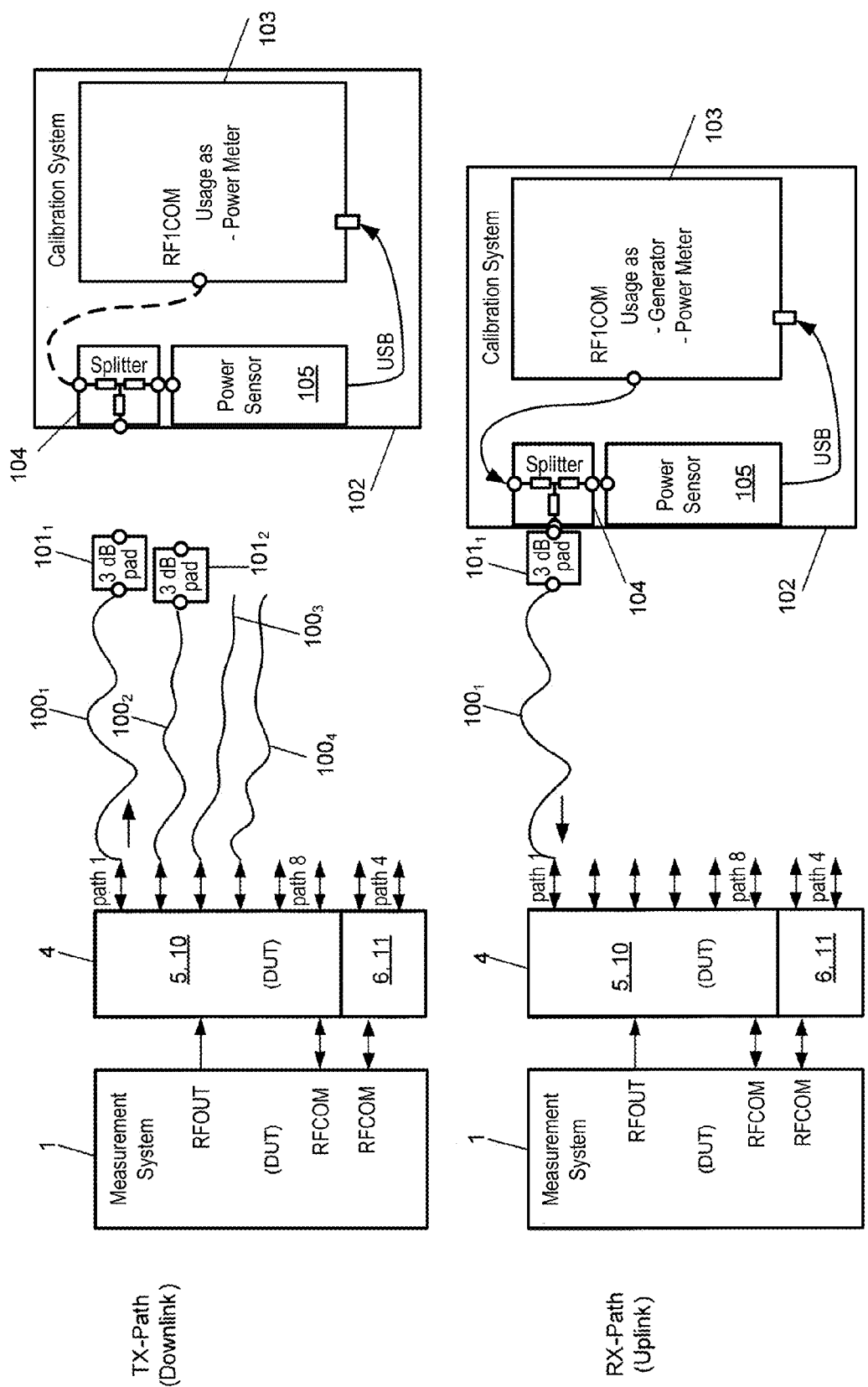
FIG. 8 a measurement system, a switch-extender and a calibration system according to an embodiment of the present invention.

FIG. 8 shows a schematic diagram that describes how the measurement system 1, the switch-extender 4 and the cable connection $100_1$ to $100_4$ as well as the 3 dB attenuator $101_1$, $101_2$ are calibrated. The calibration is done by using a calibration system 102. The calibration system comprises a first measurement unit 103 and a second measurement unit 105. Both measurement units 1, 5 are connected together for example by using a USB-connection. Other connection methods can also be used. The calibration system 102 further includes a signal splitter 104. The signal splitter 104 divides an input signal into two equal output signals. The first measurement unit 103 is able to measure and to analyze a downlink signal as well as to generate a known uplink signal. In fact, the measurement unit 103 can be of the same type as the measurement system 1. The second measurement unit 105 is able to measure the signal power. The measured values are then transmitted to the first measurement unit 1 by using the USB-connection. However, it is also possible that the DUT $7_1$ to $7_4$ and $12_1$ to $12_4$ is directly connected with the cable $100_1$ to $100_4$, so that no 3 dB attenuator $101_1$, $101_2$ is needed.

Furthermore instead of using a cable $100_1$ to $100_4$ for establishing the connection other signal connectors like wave guides for example can also be used.

In the following it is described how the calibration is done. The object of the calibration is to determine the necessary settings within the measurement system 1 and the switch-extender 4 in order to generate a predefined signal level at the first or at the second or at the third antenna of the DUT. It has to be noted that all cables $100_1$ to $100_4$ as well as all connectors and the attenuators $101_1$, $101_2$ which are used within the calibration also have to be used in the later measurement steps.

Figure 10:
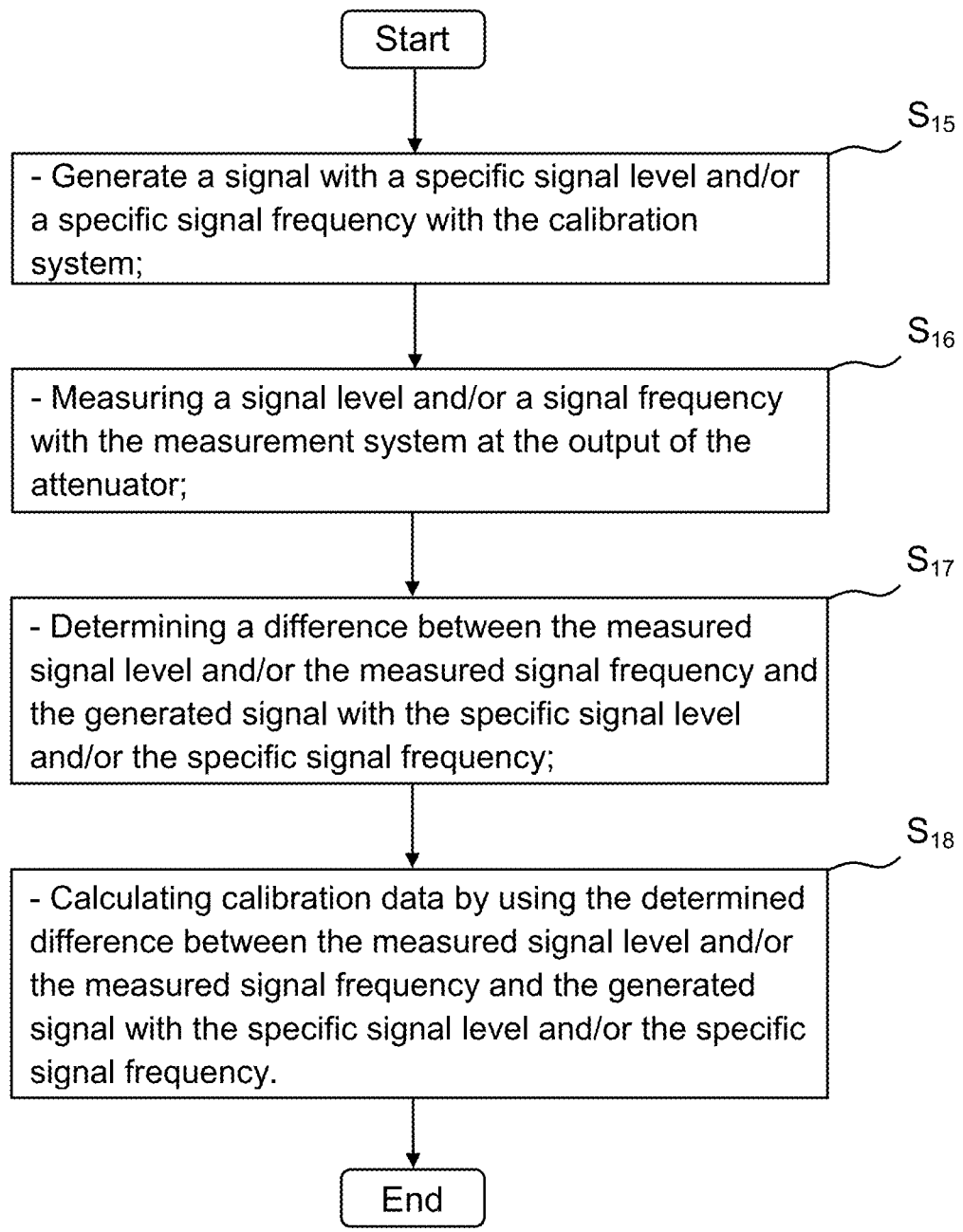
FIG. 10 another flow chat diagram of a further calibration routine according to an embodiment of the present invention.

Thus it is very important that every output port of the switch-extender 4 has its own dedicated cable. The output ports of the MUX/DEMUX-unit 5 as well as of the second MUX/DEMUX-unit 6 are connected one after another with the calibration system 102. The same also applies to the further MUX/DEMUX-unit 10 as well as for the MUX/DEMUX-unit 11. FIG. 10 only describes the calibration method for the MUX/DEMUX-unit 5 within the switch-extender 4 having eight output ports. The first output port of the MUX/DEMUX-unit 5 which is labeled with "RF1" according to FIG. 3 is connected to a cable $100_1$. The other end of the cable $100_1$ is connected to a 3 dB attenuator $101_1$. The attenuator $101_1$ would normally be connected with the first antenna of the first DUT $7_1$. In this case, the other end of the attenuator $101_1$ that is not connected to the cable $100_1$ is thereby connected with the calibration system 102. More exactly, the attenuator $101_1$ is connected with the input of the signal splitter 104 within the calibration system 102.

In the first instance, the measurement system 1 generates a downlink signal which would normally be used to measure the proper functioning of the first antenna of the first DUT $7_1$. The measurement system 1 generates this downlink signal having a specific frequency as well as a specific signal level. The downlink signal is split within the signal splitter 104 into two equal signals. One signal is transmitted to the first measurement unit 103 whereas the other signal is transmitted to the second measurement unit 103. It has to be understood that the signal splitter 14 has to be well known when thinking of its attenuation or its diversity. However, the first measurement unit 103 and the second measurement unit 105 measure the downlink signal properties, for example the frequency as well as the signal at the input port of the signal splitter 104. This data is used in order to inform the measurement system 1 about the difference between the measured values of the downlink signal and the estimated values of the downlink signal. This information is then used within the measurement system 1 to generate calibration data in order to generate a downlink signal which has a predetermined frequency as well as a predetermined signal level at the antenna port of the DUT. The calibration data can also be generated the calibration system 102.

After the calibration system 102 has generated the calibration data for the downlink signal, the calibration data for the uplink signal has also to be generated. The uplink signal as well as the downlink signal should be similar to the real signal. The uplink signal is generated by the first measurement unit 103. The first measurement unit 103 outputs the uplink signal to the signal splitter 104. One output port of the signal splitter 104 is still connected to second measurement unit 105 which is also connected the first measurement unit 103 by using a standard connection for data transmission, like USB or the like. The other output port of the signal splitter 104 is still connected with the cable $100_1$ over the 3 dB attenuator $101_1$. It is very advantageous that the cable connection has not to be changed for generating calibration data for the uplink signal. The second measurement unit 105 also measures the uplink signal generated by the first measurement unit 103 and makes sure that the uplink signal has the dedicated signal frequency as well as the dedicated signal level at the output port of the signal splitter 104. The uplink signal travels through the attenuator $101_1$ and the cable $100_1$ through the switch-extender 4 into the measurement system 1.

The measurement system 1 measures the signal frequency as well as the signal level. Based on the difference between the measured uplink signal within the measurement system 1 and the measured uplink signal at the output port of the signal splitter 105, the calibration data is obtained by the calibration system 102 or by the measurement system 1. The calibration data takes into account the downlink signal path as well as the uplink signal path. The calibration data is obtained for several frequencies as well as for several signal levels. Based on the calibration data, the measurement system 1 as well as the switch-extender 4 know how to set the attenuators, the amplifiers as shown in FIG. 3 or FIG. 4 in detail. After the first cable $100_1$ is calibrated together with the attenuator $101_1$ and all connectors, the second cable $100_2$ together with the second attenuator $101_2$ is connected to the input port of the signal splitter 104 of the calibration system 102. Then the calibration data is obtained for the second cable $100_2$ as well as the attenuator $101_2$. This is done for the downlink signal as well as for the uplink signal as described above for a specific frequency as well for a specific signal level.

The aforementioned steps are repeated for all cables $100_1$ to $100_4$ that are used for the MUX/DEMUX-unit 5 as well as for the second MUX/DEMUX-unit 6 and for the further MUX/DEMUX-unit 10 as well as for the MUX/DEMUX-unit 11.

Figure 9:
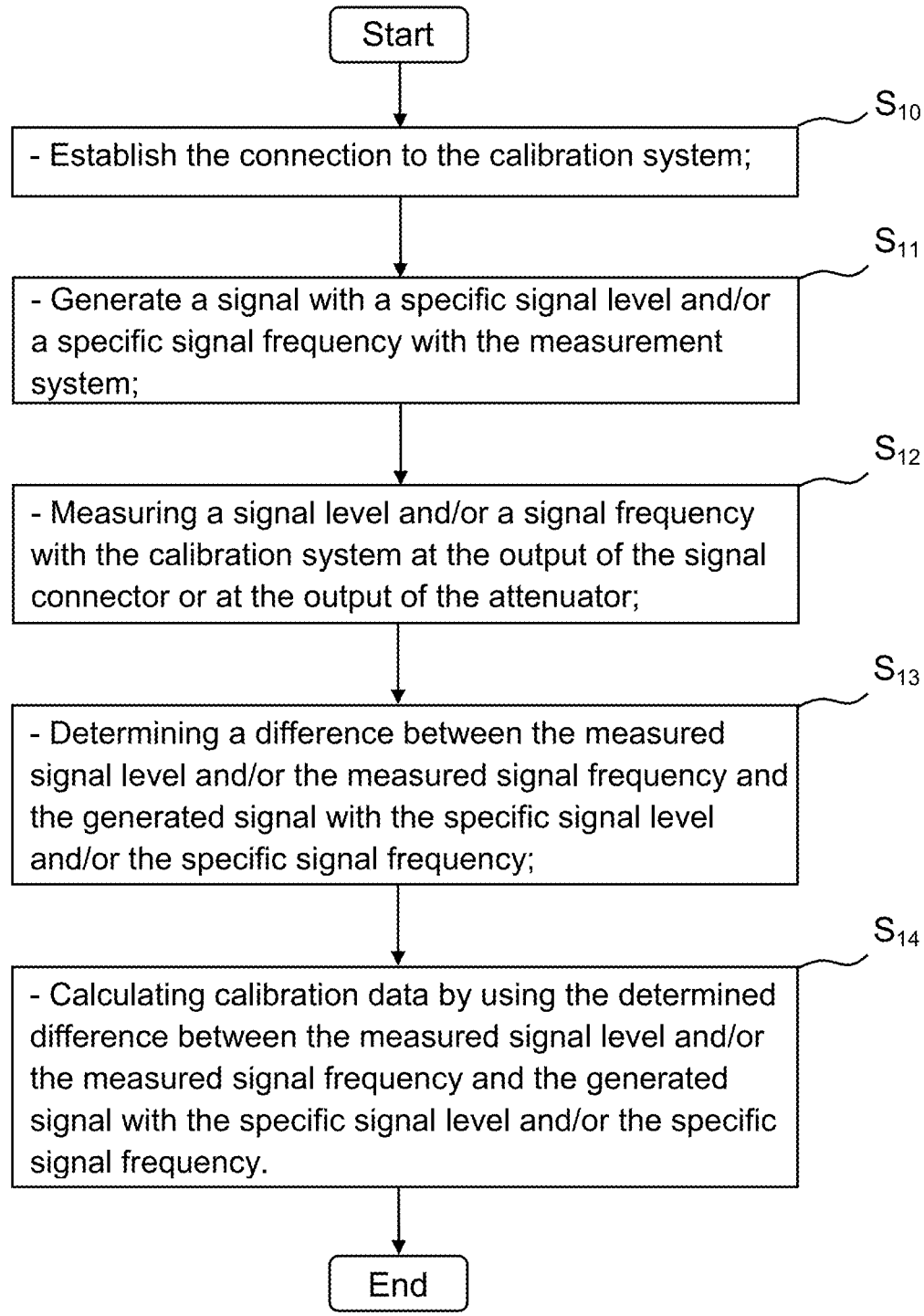
FIG. 9 a flow chart diagram of a calibration routine according to an embodiment of the present invention.

FIG. 9 shows a flow chat diagram of a calibration routine according to the present invention. The calibration routine has already been described to a certain extent. In a procedural step $S_{10}$ the connections between the switch-extender 4 and the calibration system 102 are established. Those connections can be established by using a signal connector $100_1$ to $100_4$ like a cable $100_1$ to $100_4$ or a wave guide or the like. The signal connector $100_1$ to $100_4$ can be connected directly to the calibration system 102 or through an attenuator $101_1$, $101_2$ like a 3 dB attenuator.

In the following the procedural step $S_{11}$ is executed. In this step a signal with a specific signal level and/or a specific signal frequency is generated and output by the measurement system 1 for testing the downlink path. Since the measurement system 1 is connected through the switch-extender 4 and the signal connector $100_1$ to $100_4$ to the calibration system 102, the output signal can be measured by the calibration system 102.

This is done within the procedural step $S_{12}$. The calibration system 102 measures the signal level and/or the signal frequency at the output of the signal connector $100_1$ to $100_4$ or at the output of the attenuator $101_1$, $101_2$ if used.

In the following the procedural step $S_{13}$ is executed. Within the procedural step $S_{12}$ a difference between the measured signal level and/or the measured signal frequency and the generated signal with the specific signal level and/or the specific signal frequency is determined. It is known by the calibration system 102 what signal level and/or signal frequency should be obtained so that a deviation can be calculated.

In the next procedural step $S_{14}$ calibration data are calculated by using the determined difference between the measured signal level and/or the measured signal frequency and the generated signal with the specific signal level and/or the specific signal frequency. This can be done by the calibration system 102 or even by the measurement system 1.

FIG. 10 shows a flow chat diagram of a calibration routine according to the present invention. The calibration routine has already been described to a certain extent.

In the following the procedural step $S_{15}$ is executed. It has to be noted that the measurement system 1 and the switch-extender 4 are still connected to each other and to the calibration system 102. In this step a signal with a specific signal level and/or a specific signal frequency is generated and output by the calibration system 102 for testing the uplink path. Since the measurement system 1 is connected through the switch-extender 4 and the signal connector $100_1$ to $100_4$ to the calibration system 102, the output signal can be measured by the measurement system 1. The calibration system 102 can also still measure the generated signal by itself using the second measurement unit 105.

This is done within the procedural step $S_{16}$. The measurement system 1 measures the signal level and/or the signal frequency at the output of the signal connector $100_1$ to $100_4$ or at the output of the attenuator $101_1$, $101_2$ if used.

In the following the procedural step $S_{17}$ is executed. Within the procedural step $S_{17}$ a difference between the measured signal level and/or the measured signal frequency and the generated signal with the specific signal level and/or the specific signal frequency is determined. It is known by the measurement system 1 what signal level and/or signal frequency should be obtained so that a deviation can be calculated.

In the next procedural step $S_{18}$ calibration data are calculated by using the determined difference between the measured signal level and/or the measured signal frequency and the generated signal with the specific signal level and/or the specific signal frequency. This can be done by the calibration system 102 or even by the measurement system 1.

Figure 11:
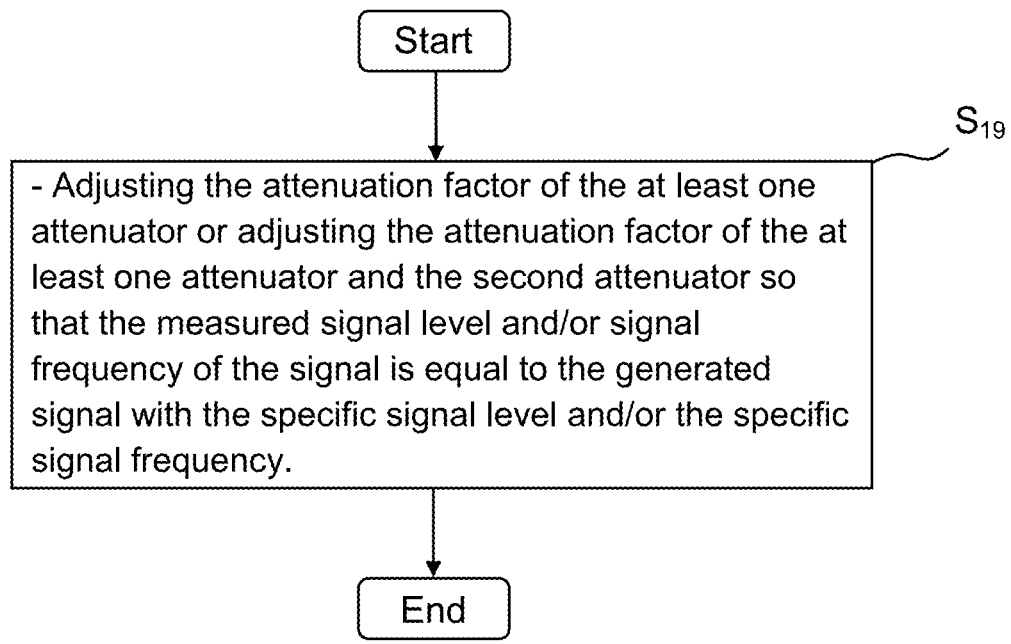
FIG. 11 another flow chat diagram of a further calibration routine according to an embodiment of the present invention.

FIG. 11 shows another flow chat diagram of a further calibration routine according to the present invention. The switch-extender 4 further comprises at least one attenuator $36_1$, $36_2$, $36_3$, $36_4$, $36_5$, $36_6$, $36_7$, $36_8$ or the at least one attenuator $36_1$, $36_2$, $36_3$, $36_4$, $36_5$, $36_6$, $36_7$, $36_8$ and a second attenuator $37_1$, $37_2$, $37_3$, $37_4$, $37_5$, $37_6$, $37_7$, $37_8$ in a row for every output port a signal connector $100_1$ to $100_4$ is connected to the switch-extender 4. Thus a procedural step $S_{18}$ can be executed. Within this step the attenuation factor of the at least one attenuator $36_1$ to $36_8$ or adjusting the attenuation factor of the at least one attenuator $36_1$ to $36_8$ and the second attenuator $37_1$ to $37_8$ can be adjusted so that the measured signal level and/or signal frequency of the signal is equal to the generated signal with the specific signal level and/or the specific signal frequency. The procedural step $S_{18}$ and the procedural steps $S_{12}$, $S_{13}$ and $S_{16}$, $S_{17}$ are executed alternately until the difference is smaller than a predefined threshold.

Figure 12:
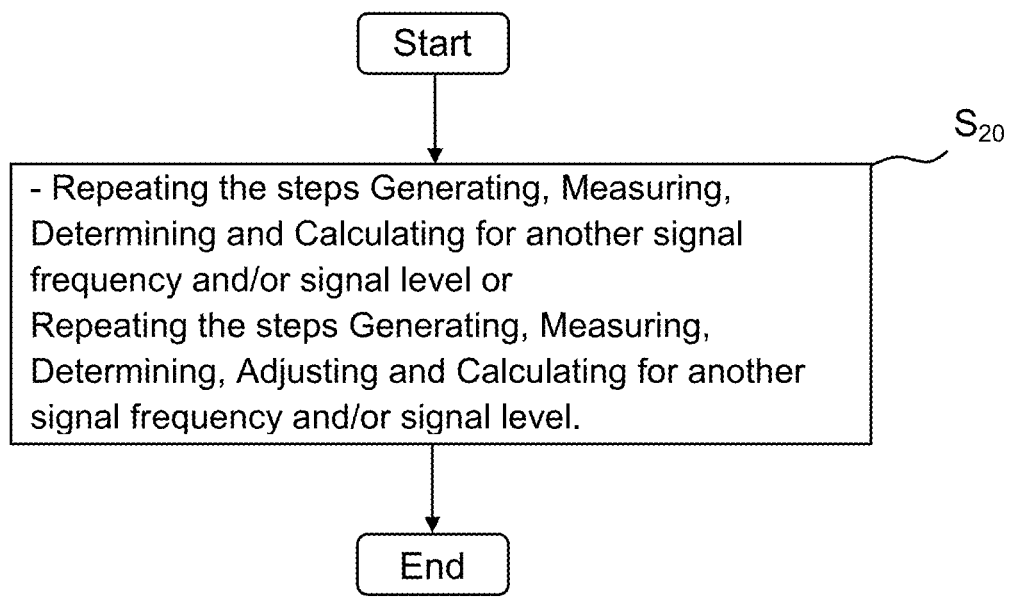
FIG. 12 another flow chat diagram of a further calibration routine according to an embodiment of the present invention.

FIG. 12 shows another flow chart diagram of a further calibration routine according to the present invention. A procedural step $S_{20}$ describes the previous steps are repeated for every desired frequency and/or signal level. The step $S_{20}$ repeats the steps Generating, Measuring, Determining and Calculating for another signal frequency and/or signal level or Repeating the steps Generating, Measuring, Determining, Adjusting and Calculating for another signal frequency and/or signal level as described above.

Figure 13:
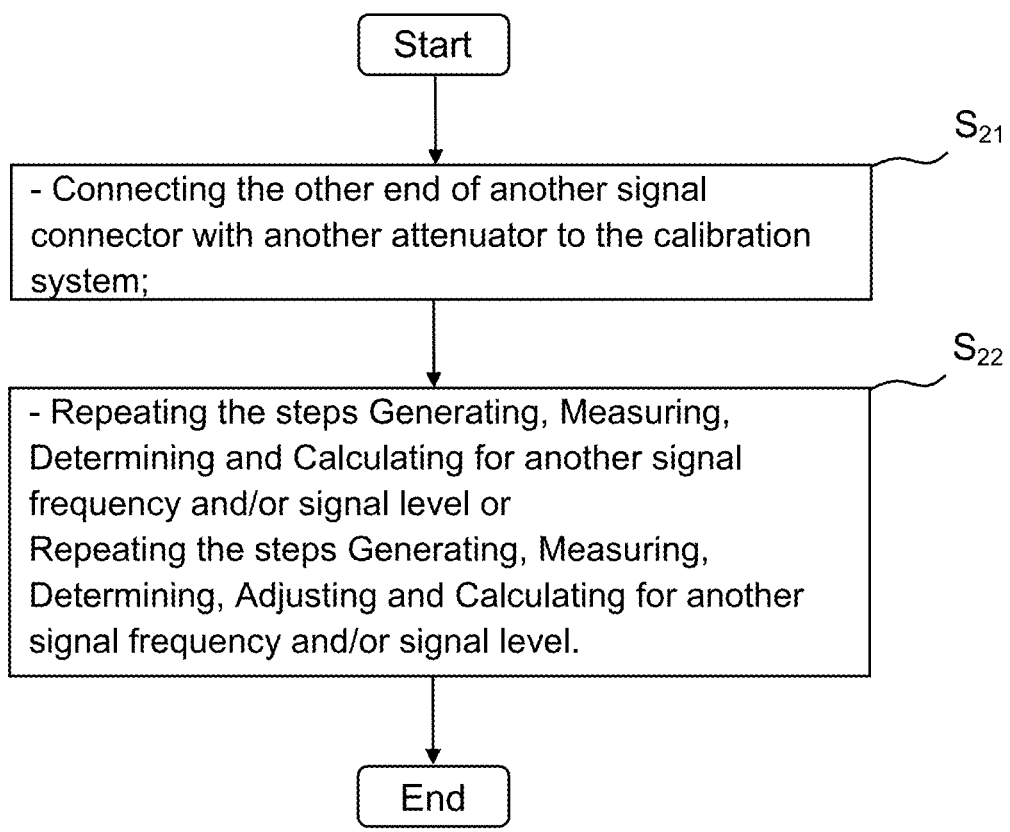
FIG. 13 another flow chat diagram of a further calibration routine according to an embodiment of the present invention.

FIG. 13 shows another flow chart diagram of a further calibration routine according to the present invention. The procedural steps $S_{21}$ and $S_{22}$ describe that after the calibration of one signal connector $100_1$ to $100_4$ and the corresponding signal path for the downlink and the uplink within the switch-extender 4 and optional for the attenuator $101_1$, $101_2$ another signal connector $100_1$ to $100_4$ is connected at another output port of the switch-extender 4. After that the procedural steps $S_{22}$ describes that the former steps Generating, Measuring, Determining and Calculating are repeated for another signal frequency and/or signal level or that the former steps Generating, Measuring, Determining, Adjusting and Calculating are repeated for another signal frequency and/or signal level.

In general, it is very important that the transmission path as well as the receiving path comprise active components like attenuators or amplifiers which are built using transistors and/or discrete elements like diodes for example or the like to compensate the loss in the signal levels. Furthermore, it is very important that those components have very fast switching times so that the actual settings can be adjusted very fast. This reduces the needed measurement time. This also allows that the signal level as well the signal frequency can be switched very fast, since the correction of the attenuator as well as the amplifiers takes place in nearly no time.

It is also possible that further switch-extenders are connected to the switch-extender 4 in order to obtain a measurement system 1 that allows measuring more than eight DUTs having two antennas used in parallel for cellular applications. However, the specific arrangement shown above is not limited to a measurement system 1 and a switch-extender 4 used for only four DUTs. All features shown above can be combined together in any order.

What is claimed is:

1. A switch-extender comprising:
    multiple input ports and multiple output ports,
    wherein a first input port, a first output port, a first group of the multiple input ports and a first group of the multiple output ports are connected to a first multiplex/demultiplex means,
    wherein the first multiplex/demultiplex means connects the first input port to the first group of output ports and the first group of input ports to the first output port,
    wherein a second group of the multiple input ports and a second output port are connected to a second multiplex/demultiplex means,
    wherein the second multiplex/demultiplex means connects the second group of input ports to the second output port,
    wherein the first multiplex/demultiplex means comprises a first signal splitter for splitting a signal at the first input port, at least one attenuator for each output port of the first group of output ports for attenuating the split signal at every output port, and a first multiplexer for multiplexing one signal of the first group of input ports to the first output port,
    wherein the second multiplex/demultiplex means comprises a second multiplexer for multiplexing one signal of the second group of input ports to the second output port,
    wherein the second multiplex/demultiplex means further comprises the same elements as the first multiplex/demultiplex means with the difference that the second output port is connected to a switch and that one output port of the switch is connected to an input port of an amplifier and that another output port of the switch is connected to an output port of another amplifier which amplifies a signal from the second multiplexer so that the second output port acts as a bidirectional port,
    wherein the first input port, the first group of input ports, and the second group of input ports are different input ports, and
    wherein the first output port, the second output port, and the first group of output ports are different output ports.

2. The switch-extender according to claim 1,
    wherein the first multiplex/demultiplex means comprises at least one second signal splitter splitting the signal at the first input port into at least two signals and providing the split signal to at least one amplifier for amplifying the signal at the first input port.

3. The switch-extender according to claim 2,
    wherein the first signal splitter comprises several signal splitters having a third plurality of signal splitters connected to the at least one second signal splitter and having a fourth plurality of signal splitters connected directly or indirectly to the third plurality of signal splitters.

4. The switch-extender according to claim 2,
    wherein the at least one amplifier is connected to every output of the at least one second signal splitter.

5. The switch-extender according to claim 3,
    wherein the at least one attenuator is connected with every output of the at least fourth plurality of signal splitters.

6. The switch-extender according to claim 1,
    wherein a second attenuator is connected in series with the at least one attenuator and that the at least one attenuator has a larger attenuation range and higher attenuation steps than the second attenuator.

7. The switch-extender according to claim 6,
    wherein a coupling-unit is connected between the least one attenuator or the second attenuator and the corresponding output port, and
    wherein the coupling-unit has a third port at which a signal is transmitted which is input in the corresponding output port.

8. The switch-extender according to claim 7,
    wherein the third port of each coupling-unit is connected to an input port of one of at least one multiplexers,
    wherein the output port of the at least one multiplexer is connected to an attenuator, wherein the attenuator is connected to an amplifier, and wherein each amplifier is connected to an input port of a switch and the output port of the switch is connected to another output port of the switch-extender.

9. The switch-extender according to claim 1,
    wherein the switch-extender comprises a plurality of first multiplex/demultiplex means and a plurality of second multiplex/demultiplex means, wherein the input ports of the plurality of second multiplex/demultiplex means are connected to an input port of a plurality of multiplexers, wherein at least a first output port of each of the plurality of the multiplexers is connected to at least one amplifier of each of the plurality of the second multiplex/demultiplex means and wherein at least a second output port of each of the plurality of the multiplexers is connected to the output of another amplifier of each of the plurality of the second multiplex/demultiplex means.

10. The switch-extender according to claim 1,
    wherein the switch-extender further comprises a processing unit and a storage unit connected to each other wherein the processing unit controls the amplification settings of the at least one amplifier and wherein the processing unit controls the attenuation settings of the at least one attenuator in such a manner that the signal at every output port has a predetermined signal level for every frequency.

11. The switch-extender according to claim 1, wherein a signal level of every signal at each of the several output ports can be adjusted individually by the at least one amplifier and/or the at least one attenuator.

12. A switch-extender comprising:
multiple input ports and multiple output ports,
wherein a first input port, a first output port, a first group of the multiple input ports and a first group of the multiple output ports are connected to a first ultiplexer/demultiplexer,
wherein the first multiplexer/demultiplexer connects the first input port to the first group of output ports and the first group of input ports to the first output port,
wherein the second group of the multiple input ports and a second output port are connected to a second multiplexer/demultiplexer,
wherein the second multiplexer/demultiplexer connects the second group of input ports to the second output port,
wherein the first multiplexer/demultiplexer comprises a first signal splitter for splitting the signal at the first input port, at least one attenuator for each of the output ports of the first group of output ports configured to attenuate the splitted signal at every output port, and a first multiplexer for multiplexing one signal of the first group of input ports to the first output port,
wherein the second multiplexer/demultiplexer comprises a second multiplexer for multiplexing one signal of the second group of input ports to the second output port,
wherein the second multiplexer/demultiplexer further comprises the same elements as the first multiplexer/demultiplexer with the difference that the second output port is connected to a switch and that one output port of the switch is connected to an input port of an amplifier and that another output port of the switch is connected to an output port of another amplifier which amplifies a signal from the second multiplexer so that the second output port acts as a bidirectional port,
wherein the first input port, the first group of input ports, and the second group of input ports are different input ports, and
wherein the first output port, the second output port, and the first group of output ports are different output ports.

13. The switch-extender according to claim 12, wherein the first multiplexer/demultiplexer further comprises at least one amplifier configured to amplify the splitted signal and at least one second signal splitter for splitting the amplified signal, wherein the second signal splitter comprises several signal splitters having a third plurality of the signal splitters connected to the at least one first signal splitter and having a fourth plurality of the signal splitters connected to the third plurality of the signal splitters.

14. The switch-extender according to claim 12, wherein the at least one attenuator comprises a first attenuator connected in series with a second attenuator, and the first attenuator has a larger attenuation range and/or higher attenuation steps than the second attenuator.

* * * * *